US007364470B2

(12) United States Patent
Hashim

(10) Patent No.: US 7,364,470 B2
(45) Date of Patent: Apr. 29, 2008

(54) COMMUNICATIONS CONNECTORS WITH SIGNAL CURRENT SPLITTING

(75) Inventor: Amid I. Hashim, Plano, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 62 days.

(21) Appl. No.: 11/428,600

(22) Filed: Jul. 5, 2006

(65) Prior Publication Data

US 2008/0009199 A1    Jan. 10, 2008

(51) Int. Cl.
*H01R 24/00*    (2006.01)

(52) U.S. Cl. ..................... 439/676; 439/941

(58) Field of Classification Search ............... 439/676, 439/941

See application file for complete search history.

(56) References Cited

U.S. PATENT DOCUMENTS

| | | | |
|---|---|---|---|
| 5,299,956 A | 4/1994 | Brownell et al. |
| 5,310,363 A | 5/1994 | Brownell et al. |
| 5,326,284 A | 7/1994 | Bohbot et al. |
| 5,362,257 A | 11/1994 | Neal et al. |
| 5,432,484 A | 7/1995 | Klas et al. |
| 5,911,602 A | 6/1999 | Vaden |
| 5,967,853 A | 10/1999 | Hashim |
| 5,997,358 A | 12/1999 | Adriaenssens et al. |
| 6,139,371 A | 10/2000 | Troutman et al. |
| 6,165,023 A | 12/2000 | Troutman et al. |
| 6,196,880 B1 | 3/2001 | Goodrich et al. |
| 6,270,381 B1 | 8/2001 | Adriaenssens |
| 6,350,158 B1 | 2/2002 | Arnett et al. |
| 6,379,198 B1 | 4/2002 | Arnett et al. |
| 6,413,121 B1 | 7/2002 | Hyland |
| 6,443,777 B1 | 9/2002 | McCurdy et al. |
| 6,592,395 B2 | 7/2003 | Brown et al. |

(Continued)

FOREIGN PATENT DOCUMENTS

GB    2 336 249 A    10/1999

(Continued)

OTHER PUBLICATIONS

International Search Report and Written Opinion for PCT/US2007/012177; Nov. 6, 2007.

(Continued)

*Primary Examiner*—Gary F. Paumen
(74) *Attorney, Agent, or Firm*—Myers Bigel Sibley & Sajovec

(57) ABSTRACT

Communications connector include a first contact having a first section and a second section that are separated by a contact region, and a second contact having a first section and a second section that are separated by a contact region. These connectors also have a first output terminal that is connected to the contact region of the first contact by a first conductive path and a second output terminal that is connected to the contact region of the second contact by a second conductive path. In these connectors, the first conductive path includes a first segment that extends from the contact region of the first contact through at least a portion of the first section of the first contact and a second segment that extends from the contact region of the first contact through at least a portion of the second section of the first contact.

38 Claims, 17 Drawing Sheets

U.S. PATENT DOCUMENTS

| | | |
|---|---|---|
| 6,716,964 B1 | 4/2004 | Chinnadurai |
| 7,154,049 B2 | 12/2006 | Cellella et al. |
| 7,264,516 B2 * | 9/2007 | Hashim et al. ............. 439/676 |
| 7,314,393 B2 * | 1/2008 | Hashim ...................... 439/676 |
| 2003/0129880 A1 | 7/2003 | Arnett et al. |
| 2006/0160428 A1 * | 7/2006 | Hashim ...................... 439/676 |
| 2007/0082557 A1 * | 4/2007 | Hashim ...................... 439/676 |
| 2007/0178772 A1 * | 8/2007 | Hashim et al. ............. 439/676 |
| 2007/0190863 A1 * | 8/2007 | Caveney et al. ............ 439/676 |
| 2007/0212946 A1 * | 9/2007 | Bert et al. .................. 439/676 |
| 2007/0238366 A1 * | 10/2007 | Hammond et al. ......... 439/676 |
| 2007/0238367 A1 * | 10/2007 | Hammond et al. ......... 439/676 |

FOREIGN PATENT DOCUMENTS

| | | |
|---|---|---|
| GB | 2 343 558 A | 5/2000 |

OTHER PUBLICATIONS

Pictures of outlet and printed circuit board of Belden CDT CopperExpress 10GX jack (admitted prior art).

* cited by examiner

COMMUNICATIONS CONNECTORS WITH SIGNAL CURRENT SPLITTING

FIELD OF THE INVENTION

The present invention relates generally to communication connectors and more particularly to communications connectors having crosstalk compensation mechanisms.

BACKGROUND OF THE INVENTION

In an electrical communications system, it is sometimes advantageous to transmit information signals (e.g., video, audio, data) over a pair of conductors (hereinafter a "conductor pair" or a "differential pair" or simply a "pair") rather than a single conductor. The signals transmitted on each conductor of the differential pair have equal magnitudes, but opposite phases, and the information signal is embedded as the voltage difference between the signals carried on the two conductors. This transmission technique is generally referred to as "balanced" transmission. When signals are transmitted over a conductor such as a copper wire in a communications cable, electrical noise from external sources such as lightning, computer equipment, radio stations, etc. may be picked up by the conductor, degrading the quality of the signal carried by the conductor. With balanced transmission techniques, each conductor in a differential pair often picks up approximately the same amount of noise from these external sources. Because approximately an equal amount of noise is added to the signals carried by both conductors of the differential pair, the information signal is typically not disturbed, as the information signal is extracted by taking the difference of the signals carried on the two conductors of the differential pair; thus the noise signal is cancelled out by the subtraction process.

Many communications systems include a plurality of differential pairs. For example, high speed communications systems that are used to connect computers and/or other processing devices to local area networks and/or to external networks such as the Internet typically include four differential pairs. In such systems, the conductors of the multiple differential pairs are usually bundled together within a cable, and thus necessarily extend in the same direction for some distance. Unfortunately, when multiple differential pairs are bunched closely together, another type of noise referred to as "crosstalk" may arise.

"Crosstalk" refers to signal energy from a conductor of one differential pair that is picked up by a conductor of another differential pair in the communications system. Typically, a variety of techniques are used to reduce crosstalk in communications systems such as, for example, tightly twisting the paired conductors (which are typically copper wires) in a cable, whereby different pairs are twisted at different rates that are not harmonically related, so that each conductor in the cable picks up approximately equal amounts of signal energy from the two conductors of each of the other differential pairs included in the cable. If this condition can be maintained, then the crosstalk noise may be significantly reduced, as the conductors of each differential pair carry equal magnitude, but opposite phase signals such that the crosstalk added by the two conductors of a differential pair onto the other conductors in the cable tends to cancel out. While such twisting of the conductors and/or various other known techniques may substantially reduce crosstalk in cables, most communications systems include both cables and communications connectors that interconnect the cables and/or connect the cables to computer hardware. Unfortunately, the communications connector configurations that were adopted years ago generally did not maintain the conductors of each differential pair a uniform distance from the conductors of the other differential pairs in the connector hardware. Moreover, in order to maintain backward compatibility with connector hardware that is already in place in existing homes and office buildings, the connector configurations have, for the most part, not been changed. As a result, many current connector designs generally introduce some amount of crosstalk.

FIG. 1 depicts an exemplary electrical communications system in which crosstalk is likely to occur. As shown in FIG. 1, a computer 11 is connected by a cable 12 to a modular wall jack 15 that is mounted in a wall plate 19. The cable 12 contains a plurality of (typically four) differential pairs. The cable 12 further includes a modular plug 13 at each end thereof. One of the modular plugs 13 inserts into a modular jack (not pictured in FIG. 1) that is provided in the back of the computer 11, and the second modular plug 13 inserts into an opening 16 in the front side of the modular jack 15. The blades of each of the plugs 13 mate with respective contacts 1-8 (not pictured in FIG. 1) of the jack 15 into which the plug is inserted. In this manner, information signals may be communicated from the computer 11 to the modular 15. The modular jack 15 includes a connector assembly 17 at the back end thereof that receives and holds wires from a second cable 18 that are individually pressed into slots in the connector assembly 17 to make mechanical and electrical connection. The second cable 18 may connect the computer 11 to, for example, network equipment and/or the Internet.

Pursuant to certain industry standards (e.g., the TIA/EIA-568-B.2-1 standard approved Jun. 20, 2002 by the Telecommunications Industry Association), the communication system of FIG. 1 may include a total of eight information signal carrying conductors (four differential pairs). These standards also specify that, at the plug-jack mating point, the eight contacts 1-8 of the jack 15 are aligned in a row in a generally parallel, side-by-side relationship. These standards further define the specific position of the contacts 1-8 of each of the four differential pairs. The contact positions and pair assignments according to the T568B designation are shown in FIG. 2. The other designation defined in the standards, namely T568A, is similar with the exception that the assignments of pairs 2 and 3 are swapped. As shown in FIG. 2, in the plug-jack mating region where the blades of the modular plug 13 (see FIG. 1) mate with the contacts 1-8 (herein, these contacts may also be referred to as "contact wires") of the modular jack 15, the contacts of each differential pair are not equidistant from the contacts of the other differential pairs. By way of example, contact 3 (of pair 3) is closer to contact 2 (of pair 2) than to contact 1 (of pair 2). Consequently, when the conductors of pair 3 are excited differentially (i.e., when a differential information signal is transmitted over pair 3), a first amount of signal energy is coupled (capacitively and/or inductively) onto contact 2 from contact 3 and a second (lesser) amount of signal energy is coupled (capacitively and inductively) onto contact 1 from contact 3. As such, the signals induced from contact 3 onto contacts 2 and 1 of pair 2 do not completely cancel each other out, and what is known as a differential-to-differential crosstalk signal is induced on pair 1. This differential-to-differential crosstalk includes both near-end crosstalk (NEXT), which is the crosstalk measured at an input location corresponding to a source at the same location, and far-end crosstalk (FEXT), which is the crosstalk measured at the output location corresponding to a source at the input location. Both types of crosstalk comprise an undesirable signal that interferes with the information signal. Differential-to-differential crosstalk also is induced from contact 6 of pair 3 onto contacts 1 and 2 of pair 1, although the impact of this crosstalk tends to be significantly smaller due to the much greater distance (and hence reduced coupling) between contact 6 and contacts 1 and 2. Similar differential-to-differential crosstalk arises to varying degrees with respect to each of the other differential pairs in the modular plug 13 and the modular jack 15, with the highest levels of differential-to-differential crosstalk occurring between the contacts of pairs 1 and 3 due to the interlacing of the contacts of these pairs at the plug-jack mating point (i.e., the contacts of pair 1 are sandwiched between the contacts of pair 3).

A second type of crosstalk, referred to as differential-to-common mode crosstalk, may also be generated as a result of, among other things, the industry standard defined configurations for the conductors of the four differential pairs at the plug-jack mating point. Differential-to-common mode crosstalk arises where the conductors of a differential pair, when excited differentially, couple unequal amounts of energy on both conductors of another differential pair where the two conductors of the victim differential pair are treated as the equivalent of a single conductor. By way of example, the contacts of pair 3 (contacts 3 and 6) are not spaced an equal distance from the contacts of pair 2 (contacts 1 and 2) or pair 4 (contacts 7 and 8). Specifically, contact 3 is located immediately adjacent contacts 1 and 2 in the contact region, whereas contact 6 is located some distance from contacts 1 and 2. Similarly, contact 6 is located immediately adjacent contacts 7 and 8 in the contact region, whereas contact 3 is located some distance from contacts 7 and 8. As a result, when pair 3 is excited differentially, differential-to-common mode crosstalk is induced onto both pair 2 (from contact 3 of pair 3) and on pair 4 (from contact 6 of pair 3). This crosstalk is an undesirable signal that may, for example, negatively effect the overall channel performance of the communications system. While typically the highest level of differential-to-common mode crosstalk is the common mode crosstalk that is induced from pair 3 onto pairs 2 and 4, differential-to-common mode crosstalk may also be induced between various of the other differential pairs.

SUMMARY OF THE INVENTION

Pursuant to embodiments of the present invention, communication connectors are provided that include a first contact having a first section and a second section that are separated by a contact region, and a second contact having a first section and a second section that are separated by a contact region. These connectors also have a first output terminal that is electrically connected to the contact region of the first contact by a first conductive path and a second output terminal that is electrically connected to the contact region of the second contact by a second conductive path. In these connectors, the first conductive path includes a first segment that extends from the contact region of the first contact through at least a portion of the first section of the first contact, and a second segment that extends from the contact region of the first contact through at least a portion of the second section of the first contact.

In certain embodiments of these connectors, the first and second segments of the first conductive path intersect at the contact region of the first contact and also intersect at a first end of a third segment of the first conductive path that connects the first and second segments of the first conductive path to the first output terminal. An end portion of the first section of the first contact may be mounted in a wiring board, and the second segment of the first conductive path may include a contact pad on the wiring board that mates with a portion of the second section of the first contact. The second segment of the first conductive path may further include a first conductive trace on the wiring board that is electrically connected to the contact pad. The first conductive path may also include a second conductive trace on the wiring board that comprises at least part of an electrical path between the first section of the first contact and the first output terminal. The first conductive trace may intersect the electrical path between the first section of the first contact and the first output terminal.

The first segment and the second segment of the first conductive path may together form a conductive loop. The current on the first segment may have an instantaneous current that flows in a clockwise direction on the conductive loop when the current on the second segment has an instantaneous current that flows in a counterclockwise direction.

The first and second segments of the first conductive path may be sized and configured in some embodiments so that at least 50 percent of a current applied to the contact region of the first contact travels through the second segment of the first conductive path. In other embodiments, the first and second segments of the first conductive path are sized and configured so that at least 75 percent of a current applied to the contact region of the first contact travels through the second segment of the first conductive path.

In some embodiments, the connector also includes a third contact and a fourth contact. These connectors also have a third output terminal that is connected to a contact region of the third contact by a third conductive path and a fourth output terminal that is connected to a contact region of the fourth contact by a fourth conductive path. In these embodiments, the first contact and the second contact together may comprise a first differential pair of contacts, and the third contact and the fourth contact may together comprise a second differential pair of contacts. The contact region of the third contact and the contact region of the fourth contact may be sandwiched between the contact region of the first contact and the contact region of the second contact.

In some embodiments, a third differential pair of contacts is provided adjacent the first contact and a fourth differential pair of contacts is provided adjacent the second contact. The second conductive path may include a first segment that extends from the contact region of the second contact through at least a portion of the first section of the second contact and a second segment that extends from the contact region of the second contact through at least a portion of the second section of the second contact. The first and second segments of the second conductive path may intersect at the contact region of the second contact and at a first end of a third segment of the second conductive path that connects the first and second segments of the second conductive path to the second output terminal. An end portion of the first section of the second contact may be mounted in the wiring board. The second segment of the second conductive path may include a second contact pad on the wiring board that mates with a portion of the second section of the second contact when a mating connector is inserted into the communications connector. The second segment of the second conductive path may also include a third conductive trace on the wiring board that is electrically connected to the second contact pad. In some of these embodiments, the first conductive trace and the third conductive trace may form a crossover on the wiring board. In some embodiments, the magnetic coupling between the first contact and the third differential pair that results when a current is applied to the contact region of the first contact is reduced due to having some of that current flowing in the second segment.

Pursuant to further embodiments of the present invention, modular jacks are provided that include a plurality of contacts, each of the contacts including a fixed portion, a distal end and a contact region that is located between the fixed portion and the distal end. These jacks also include a plurality of output terminals that are electrically connected to respective ones of the plurality of contacts. In these jacks, the electrical connection between a first of the plurality of contacts and a first of the plurality of output terminals comprises a first conductive path and a separate second conductive path such that signal energy incident on the first of the plurality of contacts is split into a first component that travels to the first of the plurality of output terminals via the first conductive path and a second component that travels to the first of the plurality of output terminals via the second conductive path.

The first and second conductive paths need not extend the full distance from the first of the plurality of contacts to the first of the plurality of output terminals. By way of example, in some embodiments, the first conductive path and the second conductive path each extend from the contact region to an intersection point where the first and second conductive paths meet. From this intersection point, a third conductive path electrically connects the first and second conductive paths to the first of the plurality of output terminals. The first conductive path may extend from the contact region on the first of the plurality of contacts through the fixed portion of the first of the plurality of contacts to the intersection point. The second conductive path may extend from the contact region on the first of the plurality of contacts through at least a portion of the first of the plurality of contacts between the contact region and the distal end of the first of the plurality of contacts to the intersection point. The second conductive path may further include a contact pad on a wiring board that makes electrical contact with the first of the plurality of contacts when a mating connector is inserted into the communications connector and a first conductive trace on the wiring board that electrically connects the contact pad to the intersection point.

Pursuant to still further embodiments of the present invention, modular jacks are provided that include a first contact having a fixed end, a free end and a contact region that is configured to make electrical contact with a contact of a mating modular plug, a first output terminal, a first conductive path that is configured to carry current flowing from the contact region of the first contact toward the free end of the first contact to the first output terminal and a second conductive path that is configured to carry current flowing from the contact region of the first contact toward the fixed end of the first contact to the first output terminal.

In some embodiments, these modular jacks also include a wiring board that includes a first contact pad that makes electrical contact with the first contact when the modular plug is inserted into the modular jack and a first conductive trace that connects the first contact pad to the first output terminal. In such embodiments, the first contact pad and the first conductive trace are part of the first conductive path. The second conductive path may comprise a second conductive trace on the wiring board that connects the fixed end of the first contact to the first output terminal. The first and second conductive traces may include one or more common conductive trace segments (i.e., the first and second conductive paths may, in some locations, share a conductive trace segment).

Pursuant to still further embodiments of the present invention, methods of conducting a communications signal through a communications connector are provided. Pursuant to these methods, the communications signal is received at a contact region of a contact of the communications connector. The received communications signal is split into a first component and a second component. The first component is conducted through at least a portion of the communications connector on a first conductive path, and the second component is conducted through at least a portion of the communications connector on a second conductive path that is different from the first conductive path. The first component and the second component are recombined to form a recombined communications signal. Finally, the recombined communications signal is output at an output terminal of the communications connector.

DETAILED DESCRIPTION

Figure 1:
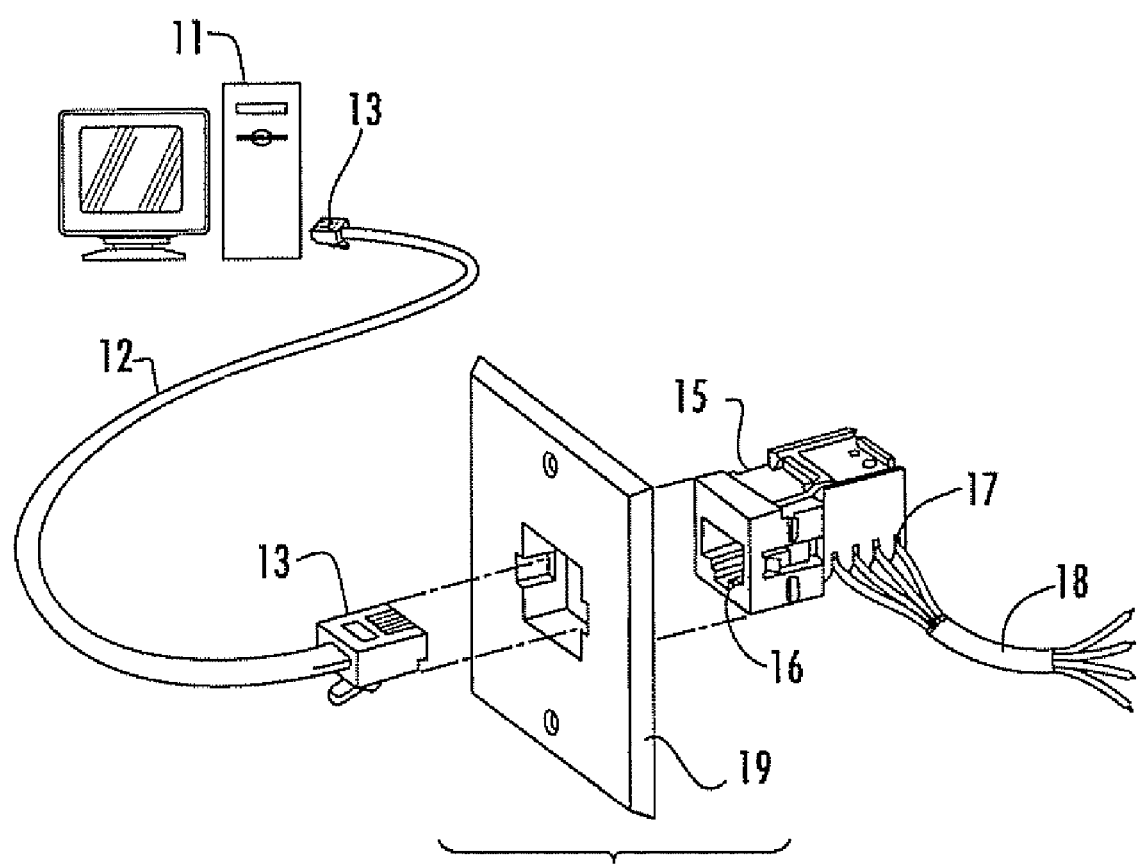
FIG. 1 is a schematic drawing that illustrates the use of modular plug and modular jack connectors to interconnect a computer with a communications cable.

The present invention will be described more particularly hereinafter with reference to the accompanying drawings. The invention is not intended to be limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

This invention is directed to communications connectors, with a primary example of such being a modular jack. As used herein, the terms "forward", "forwardly", and "front" and derivatives thereof refer to the direction defined by a vector extending from the center of the jack toward the plug opening of the jack. Conversely, the terms "rearward", "rearwardly", and derivatives thereof refer to the direction directly opposite the forward direction; the rearward direction is defined by a vector that extends away from the plug opening toward the remainder of the jack. Where used, the terms "attached", "connected", "interconnected", "contacting", "mounted" and the like can mean either direct or indirect attachment or contact between elements, unless stated otherwise.

Herein, the term "conductive path" refers to a current carrying path on which an information signal can travel on its way from the input to the output of a communications connector. Conductive paths may include, for example, a series of conductive trace segments on a wiring board, plated-through holes, portions of contact wires, conductive pads, and/or various other electrically conductive components over which an information signal may be transmitted. A conductive path need not extend the entire way from the input to the output of the connector, but can instead connect to one or more additional conductive paths that complete the information signal carrying path from the input to the output of the connector. Each conductive path may have multiple segments, which may be arranged in series and/or which may be arranged in parallel to implement signal current splitting concepts according to embodiments of the present invention. Branches that extend from a conductive path and then dead end such as, for example, a branch from the conductive path that forms one of the electrodes of an interdigitated finger capacitor, are not considered part of a conductive path, even though these branches are electrically connected to the conductive path, as the communications signal does not flow through such dead end branches on its way from the input to the output of the connector.

Herein, the term "conductive trace" refers to a conductive path implemented from a first point to a second point on a wiring board. A conductive trace may include multiple conductive trace segments which may be implemented on one or more layers of the wiring board, and may also include plated through holes or other known elements that may be used to electrically connect conductive trace segments.

Herein, the term "contact" and the term "output terminal" refer to, respectively, an interface element to a mating connector at which an information signal (or a portion thereof) is input into or output from a communications connector and an interface element to a terminating cable at which an information signal (or a portion thereof) is output from or input into the communications connector. The contact, may, for example, comprise a contact wire, a trace on a flexible printed circuit board, a plug blade, etc. The output terminal may, for example, comprise an insulation displacement contact (IDC), another wire connector, a cable wire, etc.

Figure 3:
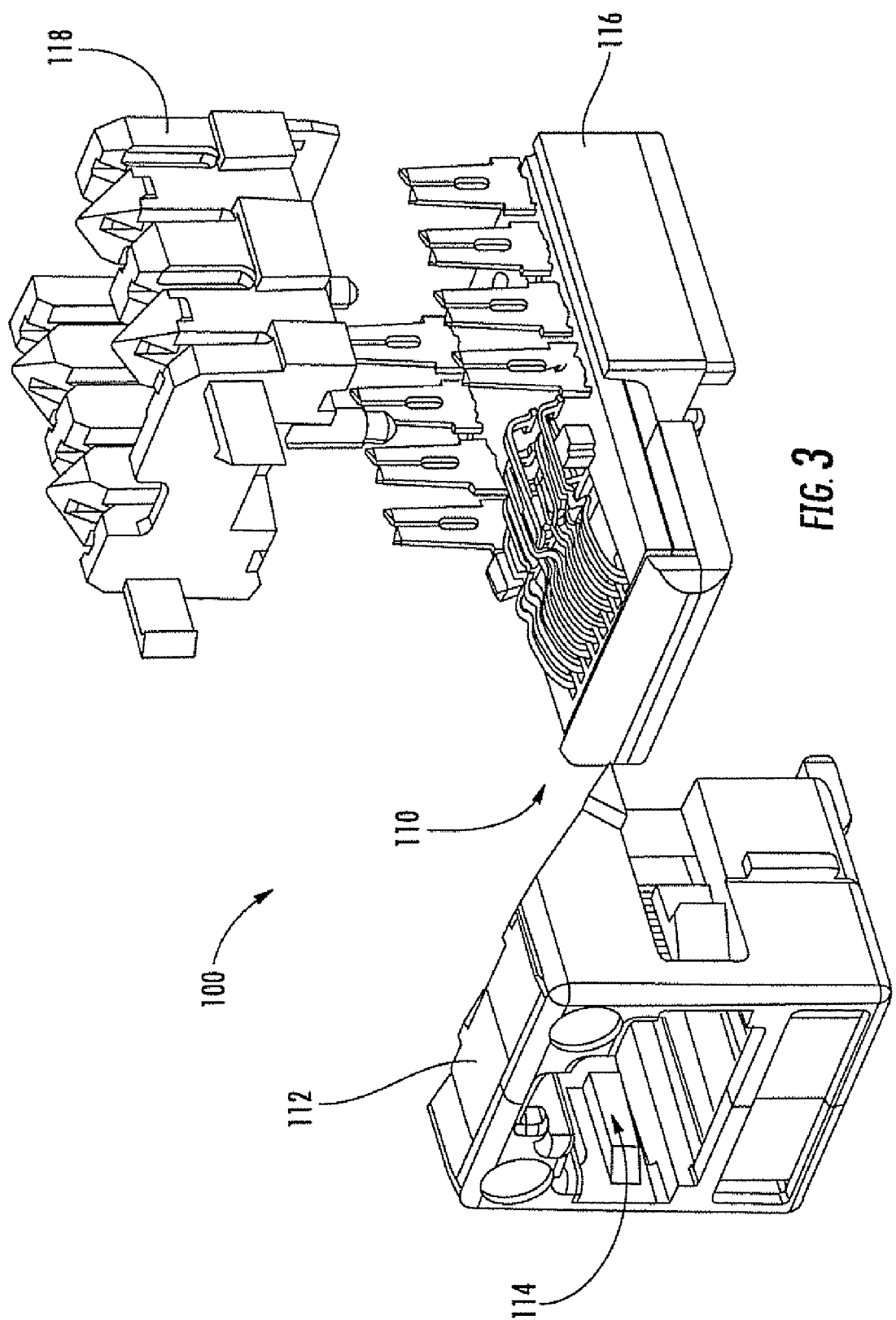
FIG. 3 is an exploded perspective view of a communications jack according to embodiments of the present invention.

FIGS. 3-8 depict a communications connector 100 according to some embodiments of the present invention. The communications connector 100 depicted in FIGS. 3-8 is a modular jack 100. As shown in FIG. 3, the jack 100 includes a jack frame or housing 112 having a plug aperture 114 for receiving a mating plug (not shown in FIG. 3), a cover 116 and a terminal housing 118. These components may be conventionally formed and not need be described in detail herein. For a further description of these components and the manner in which they interconnect, see, for example, U.S. Pat. No. 6,350,158 to Arnett et al., the disclosure of which is hereby incorporated herein in its entirety. Those skilled in this art will recognize that other configurations of jack frames, covers and terminal housings may also be employed with the present invention. An example of such other configurations is illustrated in U.S. Pat. No. 6,165,023 to Troutman et al., the disclosure of which is hereby incorporated herein in its entirety.

As can also be seen in FIG. 3, the jack 100 further includes a communications insert 110. The communications insert 110 is received into an opening in the rear of the jack frame 112. A first surface of the communications insert 110 is protected by the cover 116, and a second surface of the communications insert 110 is covered and protected by the terminal housing 118. It will be appreciated that the jack 100 of FIGS. 3-8 would typically be inverted to have the orientation shown in FIG. 2 when installed, as such an orientation can reduce buildup of dust and dirt on the jack contacts that may degrade the electrical connection between the plug blades and the jack contacts.

Figure 4:
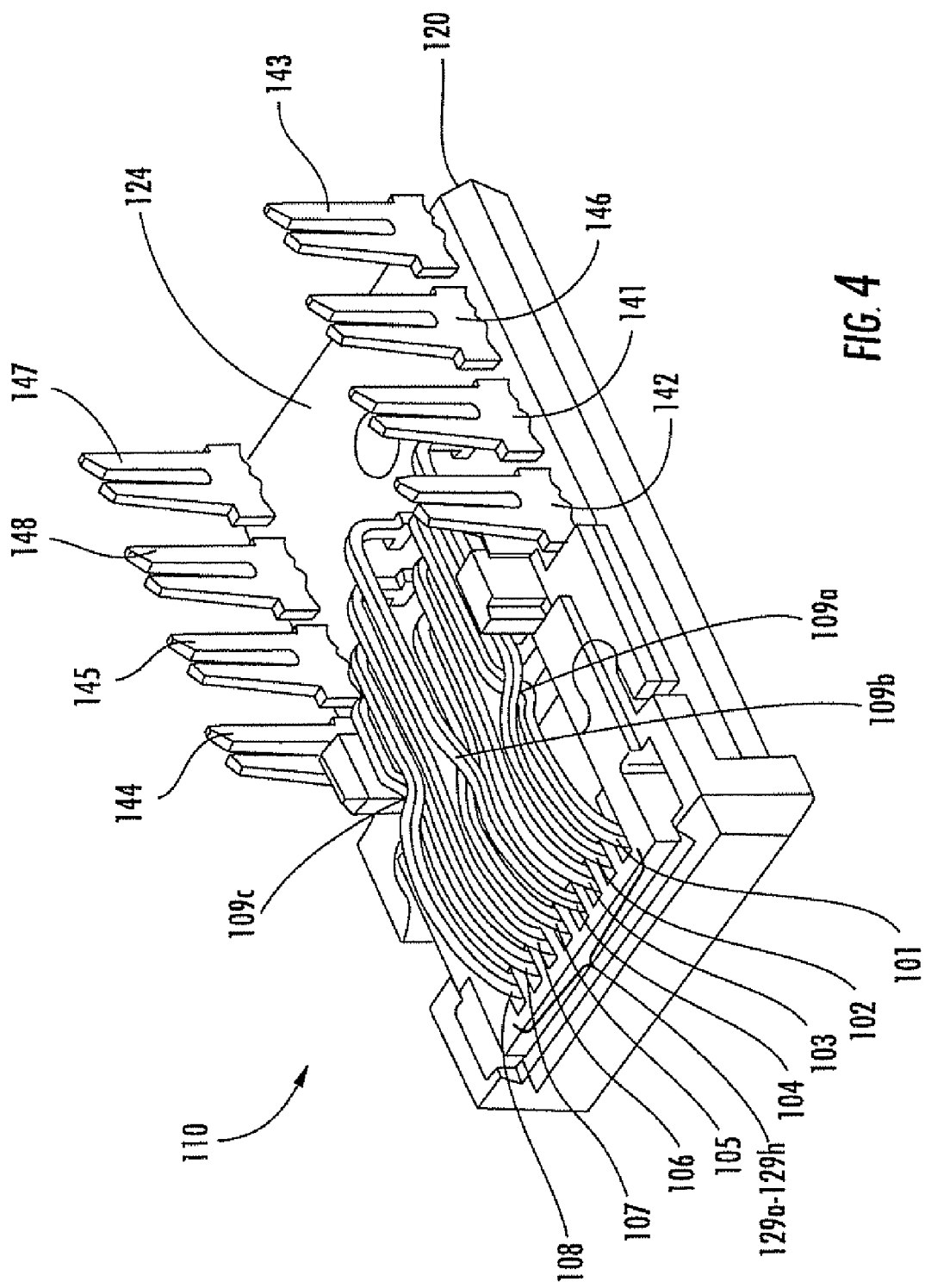
FIG. 4 is an enlarged, partial perspective view of the communications insert of the jack of FIG. 3.

FIG. 4 is an enlarged view of the communications insert 110. The communications insert 110 includes a wiring board 120, which may be formed of conventional materials. Specialized wiring boards such as, for example, flexible printed circuit boards could also be used. In the embodiment of the present invention depicted in FIGS. 3-8, the wiring board 120 comprises a multi-layer printed wiring board that is substantially planar. As shown in FIG. 4, eight contacts 101-108 are mounted on a top surface 124 of the wiring board 120. The contacts 101-108 may comprise conventional contacts such as the contacts described in U.S. Pat. No. 6,350,158 referenced above. As shown best in FIGS. 7 and 8, each of the contact wires 101-108 has a fixed portion 101a-108a that is mounted in the wiring board 120, and a distal end 101b-108b that terminates near a forward portion of the top surface 124 of the printed wiring board 120. In this particular embodiment, the distal ends 101*b*-108*b* are "free" ends in that they are not mounted in the wiring board 120 or in another substrate, and hence can deflect when a plug is inserted into the jack 100. Each of the contacts 101-108 also includes a contact region 101*c*-108*c* that is located between the fixed portion 101*a*-108*a* and the distal end 101*b*-108*b* of the contact. The contact region 101*c*-108*c* divides each contact into a first section 101*d*-108*d* and a second section 101*e*-108*e*. The jack is configured so that each blade of a mating plug comes into contact with the contact region 101*c*-108*c* of respective ones of the contacts 101-108 when a plug is inserted into the plug aperture 114. The contacts 101-108 may have substantially the same profile, as shown in FIG. 6, and may be substantially transversely aligned in side-by-side relationship. However, in other embodiments of the present invention, the contacts 101-108 may have different profiles and may not be in a side-by-side relationship (except in the contact region 101*c*-108*c* to the extent required by regulatory standards). Each of the contacts 101-108 extends into the plug aperture 114 to form physical and electrical contact with the blades of a mating plug 13. As shown best in FIG. 4, the distal ends 101*b*-108*b* of the contact wires 101-108 may extend into individual slots 129*a*-129*h* that are provided at or near a forward edge of the top surface 124 of the wiring board 120.

Figure 2:
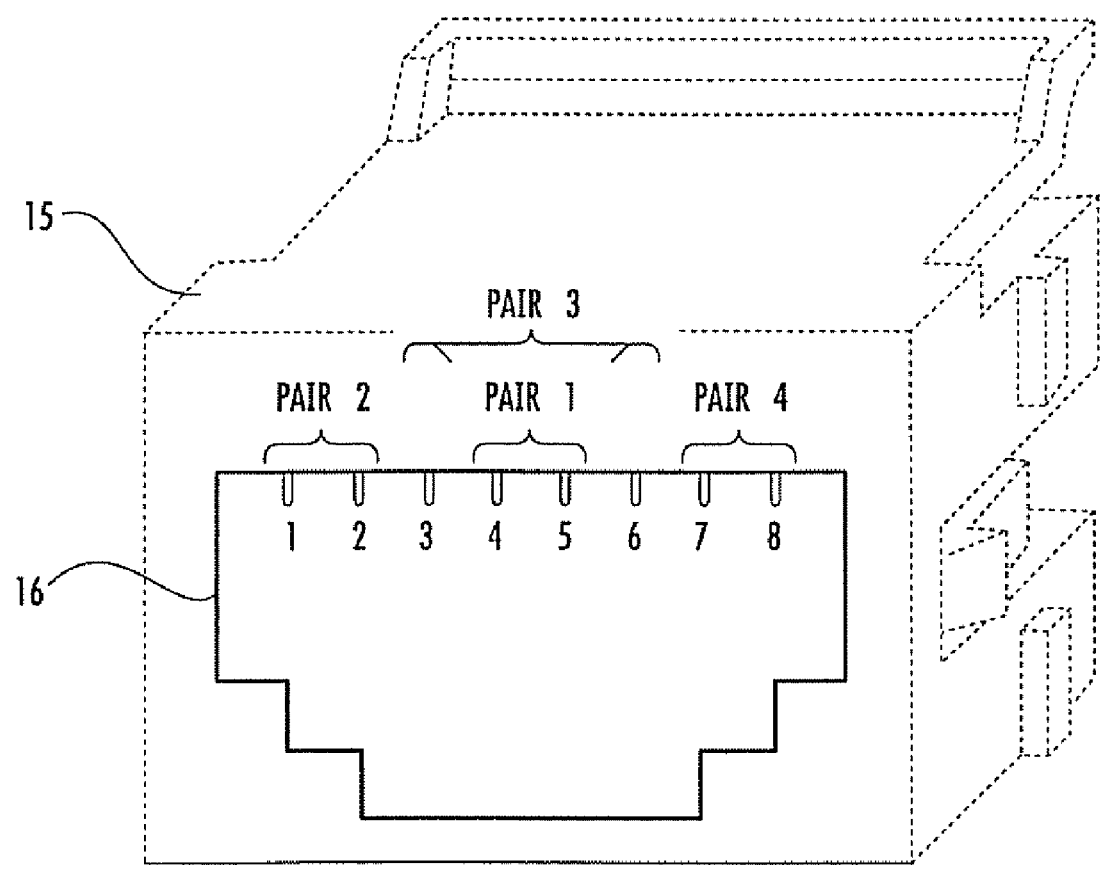
FIG. 2 is a front perspective view of a modular jack illustrating the contact and pair assignments for an 8-position telecommunications outlet (T568B).

The contact wires 101-108 are arranged in pairs defined by TIA 568B (see FIG. 2 and the discussion above). Accordingly, contacts 104, 105 (pair 1) are adjacent to each other and in the center of the sequence of contacts, contacts 101, 102 (pair 2) are adjacent to each other and occupy the rightmost two contact positions (from the vantage point of FIG. 4), contacts 107, 108 (pair 4) are adjacent to each other and occupy the leftmost two positions (from the vantage point of FIG. 4), and contacts 103, 106 (pair 3) are positioned between, respectively, pairs 1 and 2 and pairs 1 and 4. Note that these contact positions are consistent with the contact positions depicted in FIG. 2, as the jack in FIGS. 3 and 4 is depicted in an inverted orientation.

Figure 5A:
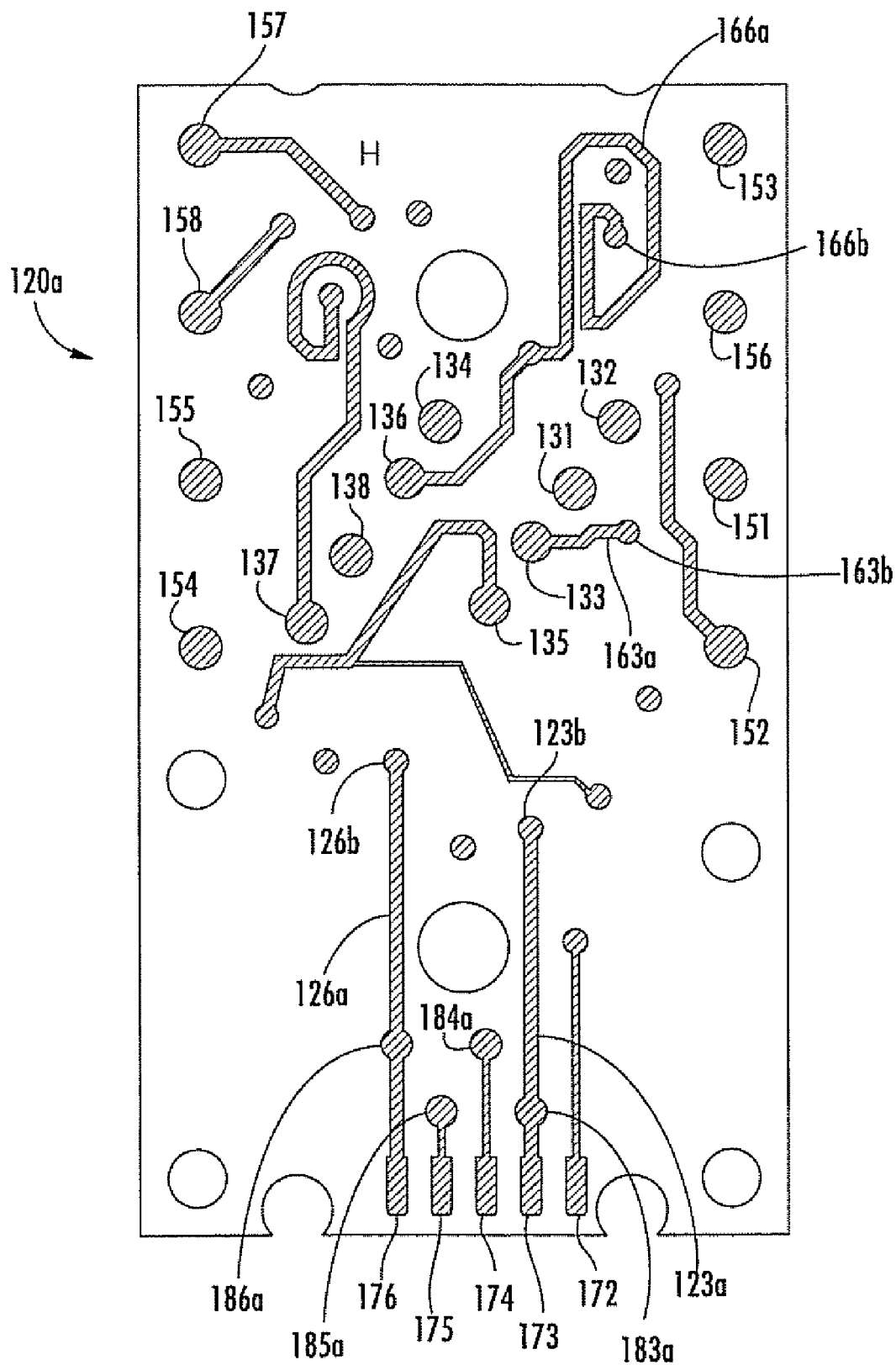
FIGS. 5A-F are top views of each layer of the wiring board of the jack of FIG. 3.
Figure 5B:
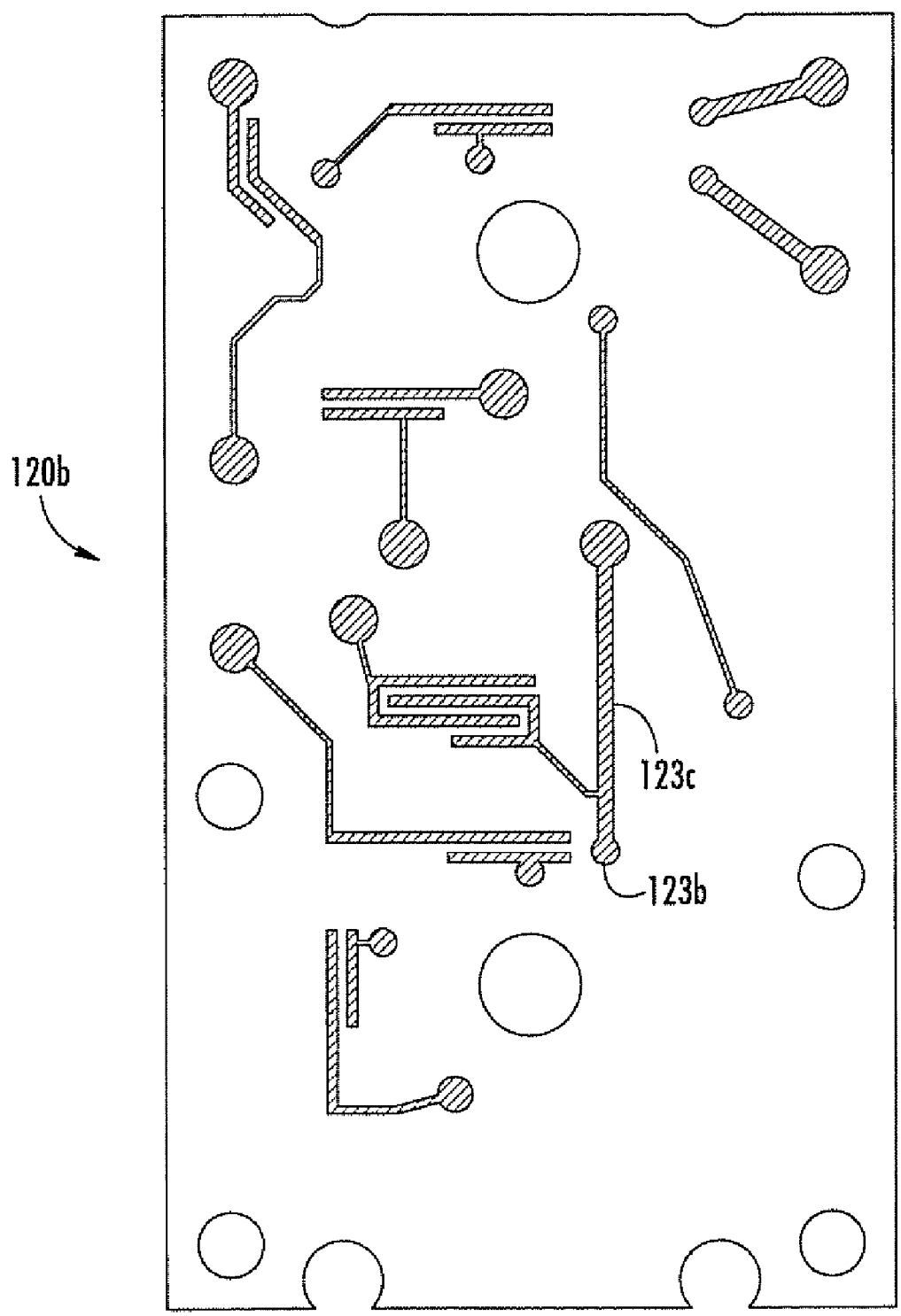
Figure 5C:
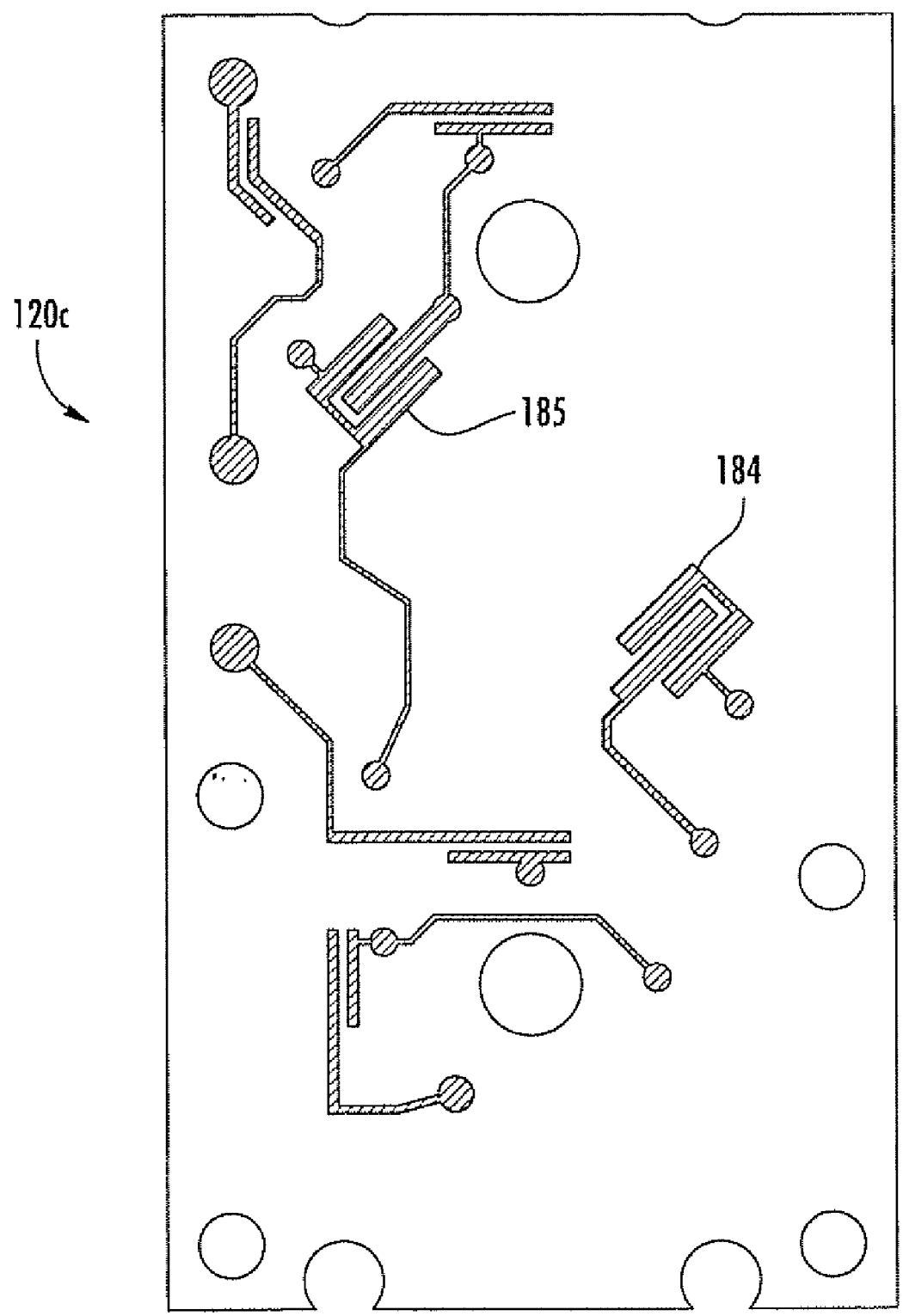
Figure 5D:
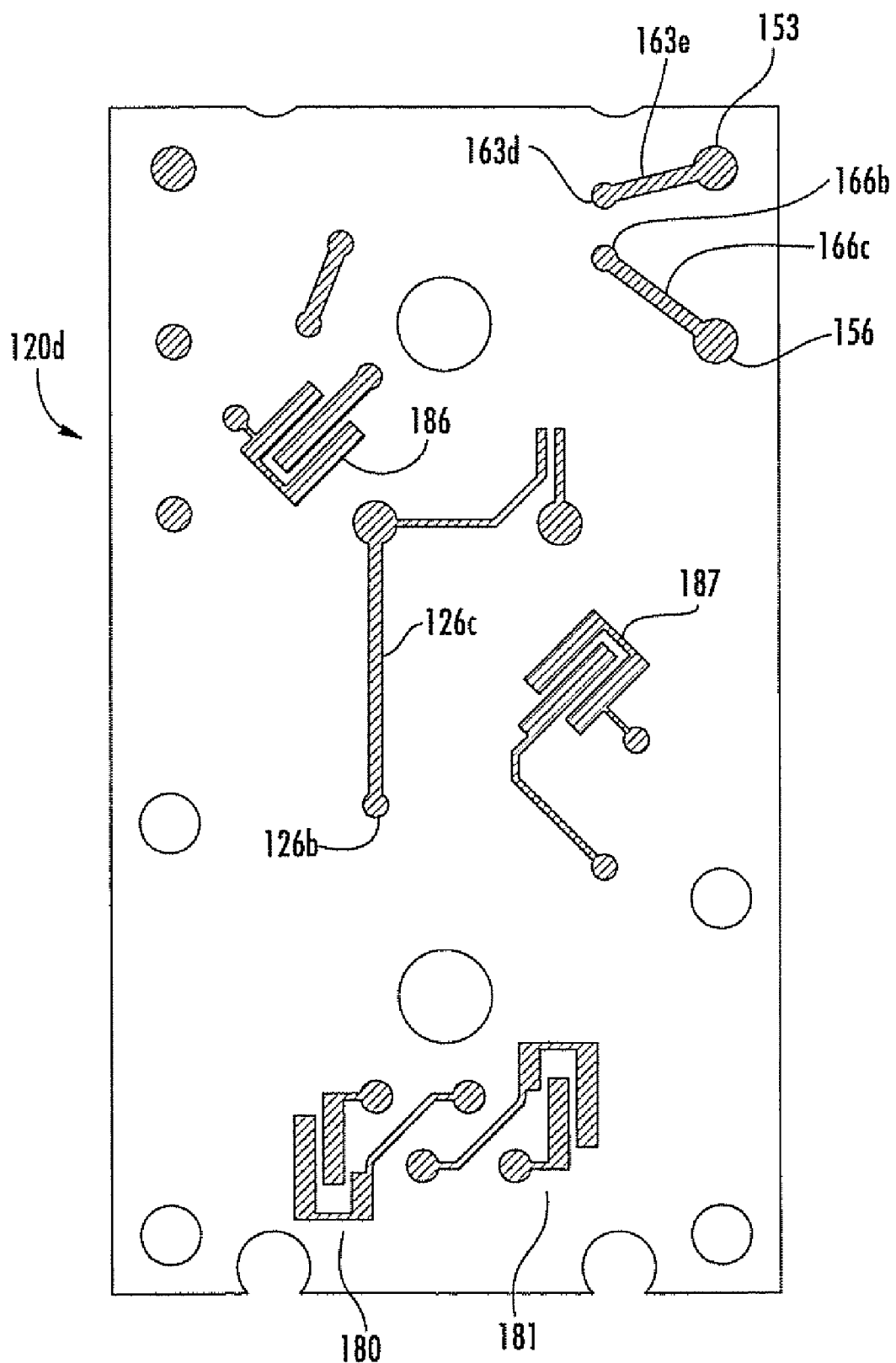
Figure 5E:
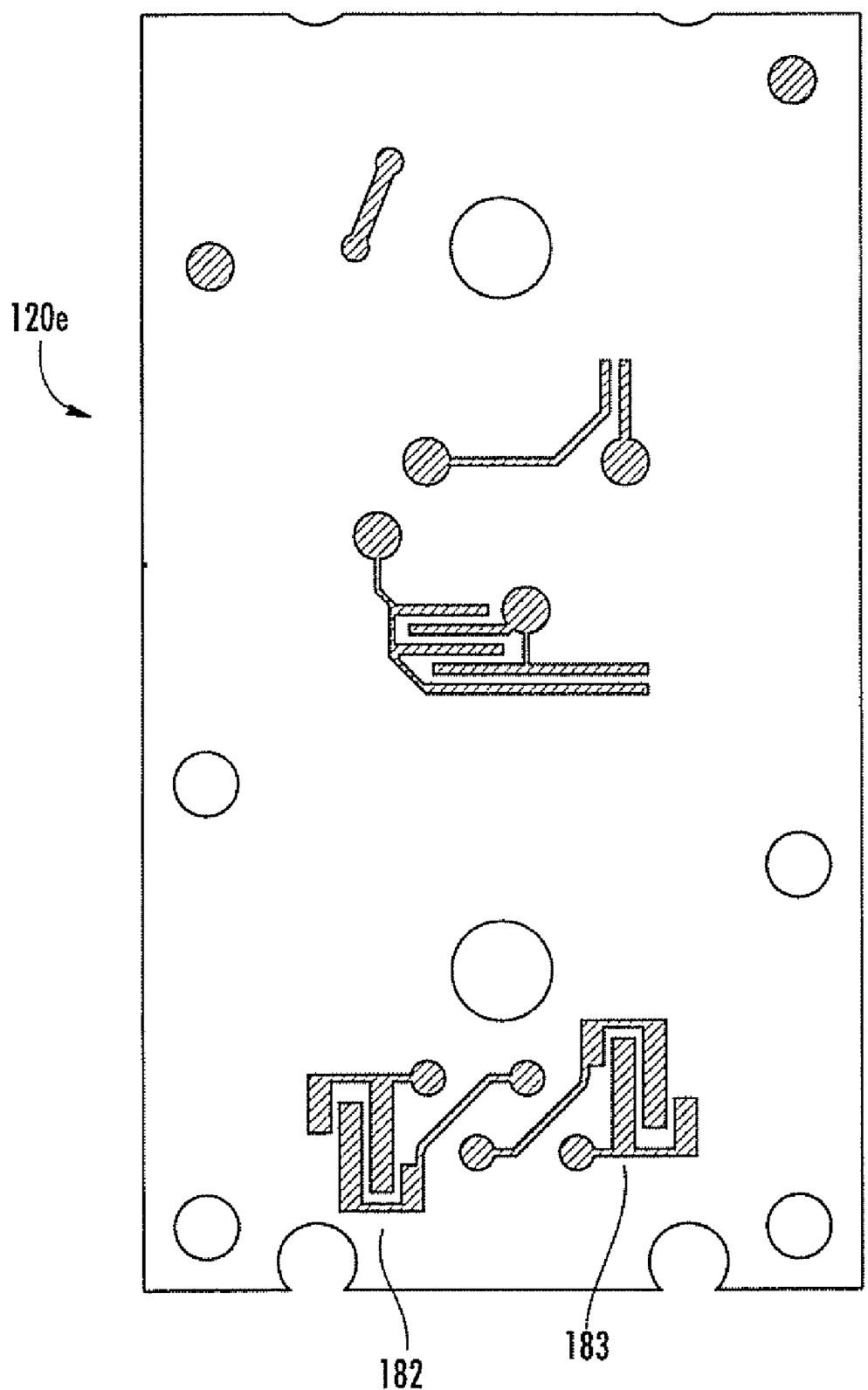

As shown best in FIGS. 4 and 5A, the contacts 101-108 are mounted to the wiring board 120 via insertion into respective apertures 131-138. These apertures 131-138 may comprise, for example, metal-plated holes or "vias". The contacts 101-108 may be interference fit within the apertures 131-138. In the embodiment of FIGS. 3-8, the apertures 131-138 are arranged in a "dual diagonal" pattern (see FIG. 5A) known to those skilled in this art as described in U.S. Pat. No. 6,196,880 to Goodrich et al., the disclosure of which is hereby incorporated herein in its entirety. Those skilled in this art will appreciate that contact wires or other contacts of other configurations may be used. As one example, contact wires configured as described in aforementioned U.S. Pat. No. 6,165,023 to Troutman et al. may be employed.

Figure 6:
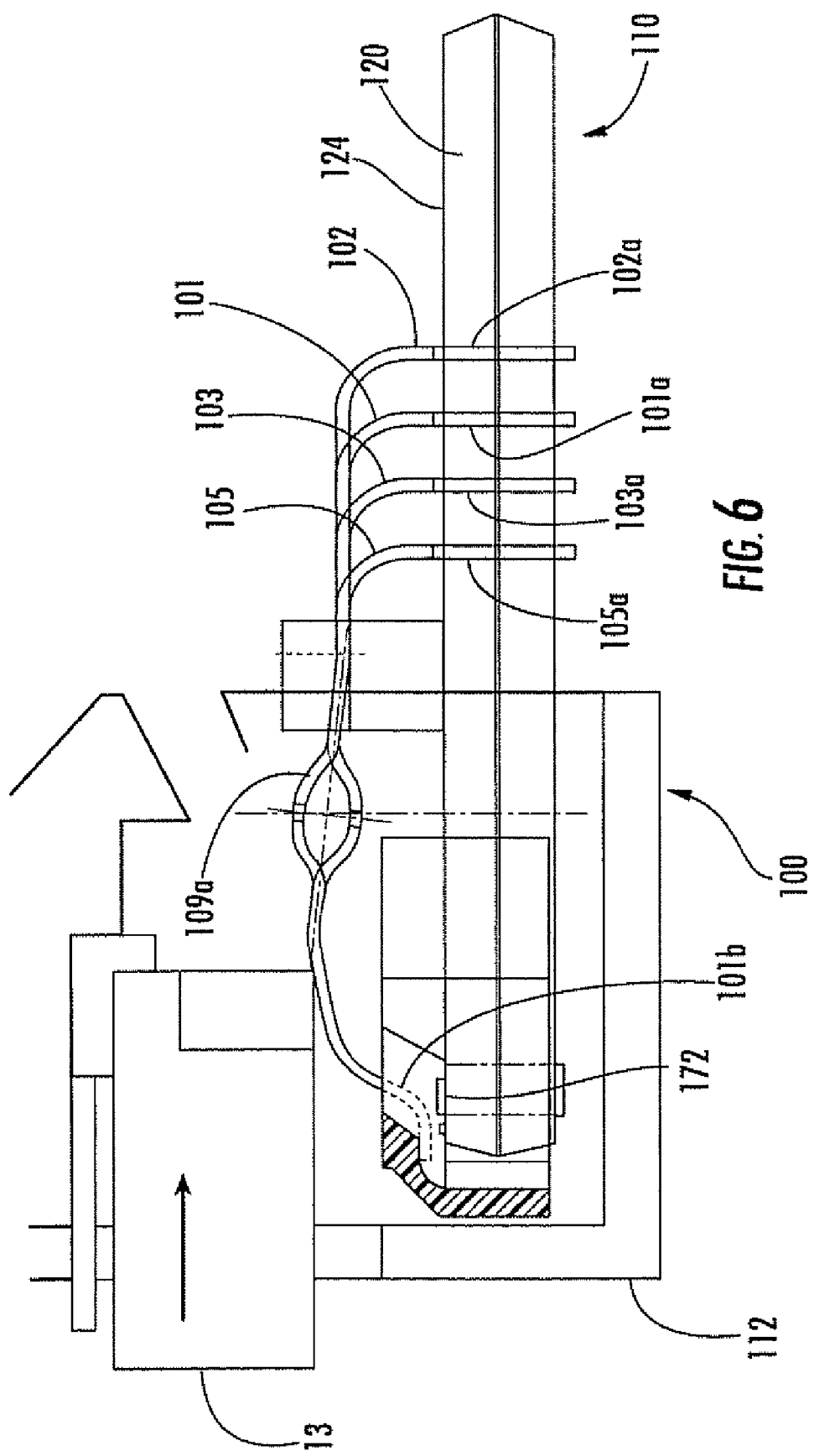
FIG. 6 is a side view of contacts of the jack of FIG. 3.
Figure 7:
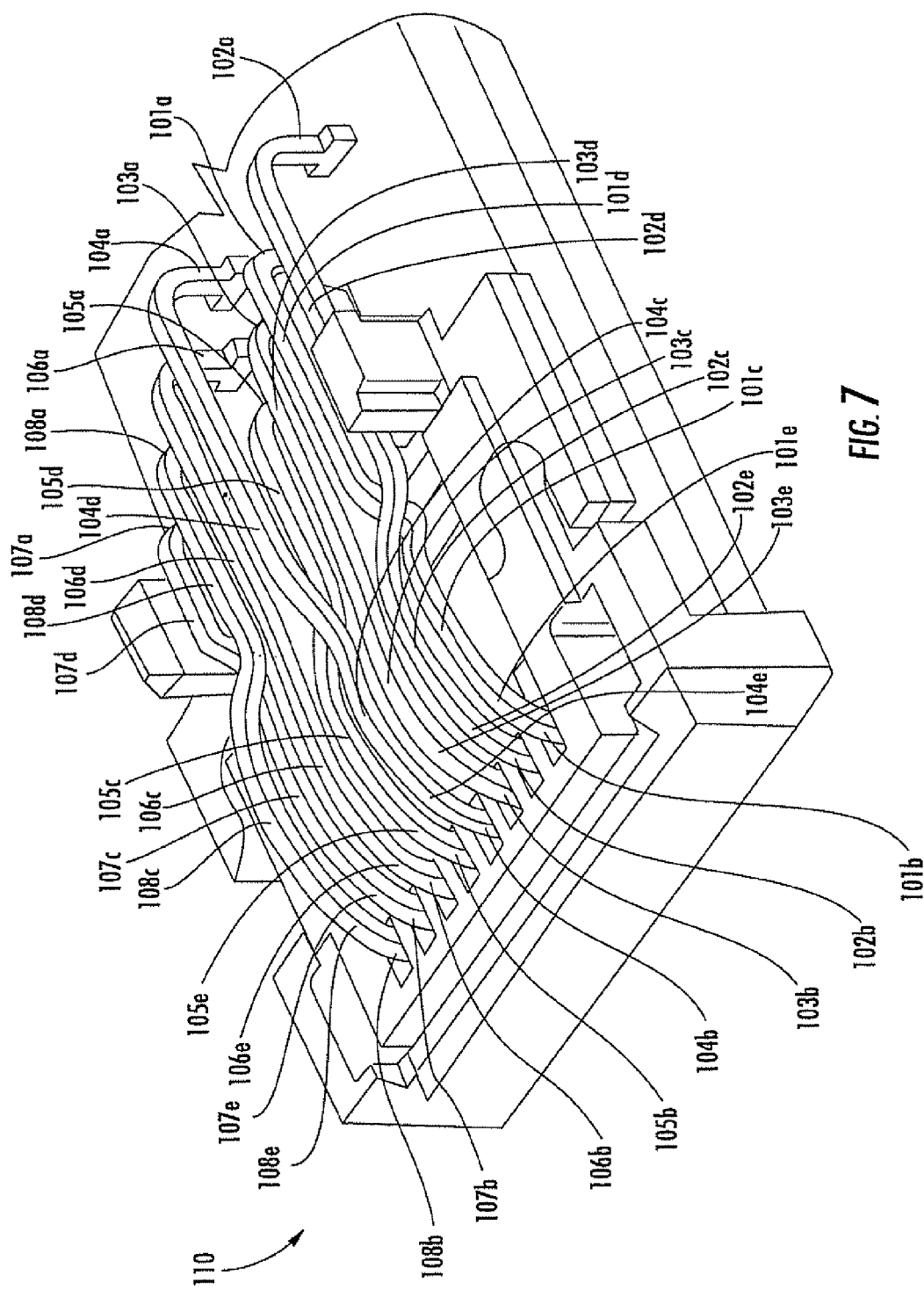
FIG. 7 is a further enlarged, partial perspective view of the communications insert of FIG. 4.

As can be seen in FIGS. 4 and 6-7, contacts 101 and 102 (pair 2), contacts 104 and 105 (pair 1) and contacts 107 and 108 (pair 4) each include a "crossover" 109*a*, 109*b*, 109*c*, respectively, in which the contacts of the respective differential pairs cross each other without making electrical contact when viewed from above or below. In this particular embodiment, the crossovers 109*a*, 109*b*, 109*c* are configured so that the contacts of differential pairs 1, 2 and 4 trade positions on opposite sides of the crossover. In particular, as shown in FIGS. 4 and 6, the crossovers 109*a*, 109*b*, 109*c* are configured such that the distal end of one contact of the pair (e.g., the distal end 102*b* of contact 102) is substantially longitudinally aligned with the fixed end portion of the other contact of the pair (e.g., the fixed end 101*a* of contact 101).

It will be appreciated however, that crossovers need not have such aligned conductors and, in fact, when crossovers are implemented on a printed wiring board of the connector, the traces will typically not be substantially longitudinally aligned as described above. As shown in FIGS. 4 and 6, in this particular embodiment the crossovers 109*a*, 109*b*, 109*c* are located between the contact region 101*c*-108*c* where the contacts make physical and electrical contact with the blades of a mating plug and the fixed portion 101*a*-108*a* of the contacts that are mounted in the wiring board 120.

The crossovers 109*a*, 109*b*, 109*c* are included to provide compensatory crosstalk. In the illustrated embodiment, the crossovers 109*a*, 109*b*, 109*c* are implemented via complementary localized bends in the contacts, with one contact being bent upwardly and the other contact being bent downwardly. The presence of a crossover, structural implementations thereof, and its effect on crosstalk are discussed in some detail in U.S. Pat. No. 5,997,358 to Adriaenssens et al. ("the '358 patent") and U.S. Pat. No. 5,186,647 to Denkmann et al., the disclosures of which are hereby incorporated herein by reference. These crossovers work in conjunction with additional crosstalk compensation stages that are included, for example, on the wiring board 120 to approximately cancel the differential-to-differential crosstalk using, among other things, the multi-stage crosstalk compensation techniques that are described in the above-referenced '358 patent. It will also be appreciated that techniques other than crossovers may be used to provide crosstalk compensation such as, for example, the inclusion of capacitors and/or inductors (or conductors that are configured to inductively couple). Such crosstalk compensation elements may be implemented on the wiring board and/or may be located elsewhere in the connector (e.g., in the jack housing).

As shown in FIG. 4, the communications insert 110 includes eight output terminals 141-148. In the particular embodiment of the present invention depicted in FIGS. 3-8, the output terminals 141-148 are implemented as IDCs 141-148 that are inserted into eight respective IDC apertures 151-158 (see FIG. 5A). The IDCs 141-148 may be of conventional construction and need not be described in detail herein. Exemplary IDCs are illustrated and described in U.S. Pat. No. 5,975,919 to Arnett, the disclosure of which is hereby incorporated by reference herein in its entirety. Note that some or all of the IDCs are omitted in FIGS. 6-8 in order to better highlight the contact configuration.

As noted above, the wiring board 120 is a multi-layer wiring board, although in other embodiments of the present invention the wiring board 120 may comprise a single layer wiring board. It will also be appreciated that more than one wiring board 120 may be included in the connector 100, and that, in certain embodiments, the techniques of the present invention could be implemented without the use of wiring boards at all. FIGS. 5A-F are top views of each layer 120*a*-120*f* of the six-layer printed wiring board 120 that is used in one particular embodiment of the present invention. It will be appreciated, however, that the present invention is not limited by the particular wiring board depicted in FIGS. 5A-5F, and that these figures are only provided so that this disclosure will be thorough and complete and readily understandable to those of skill in the art.

Figure 5F:
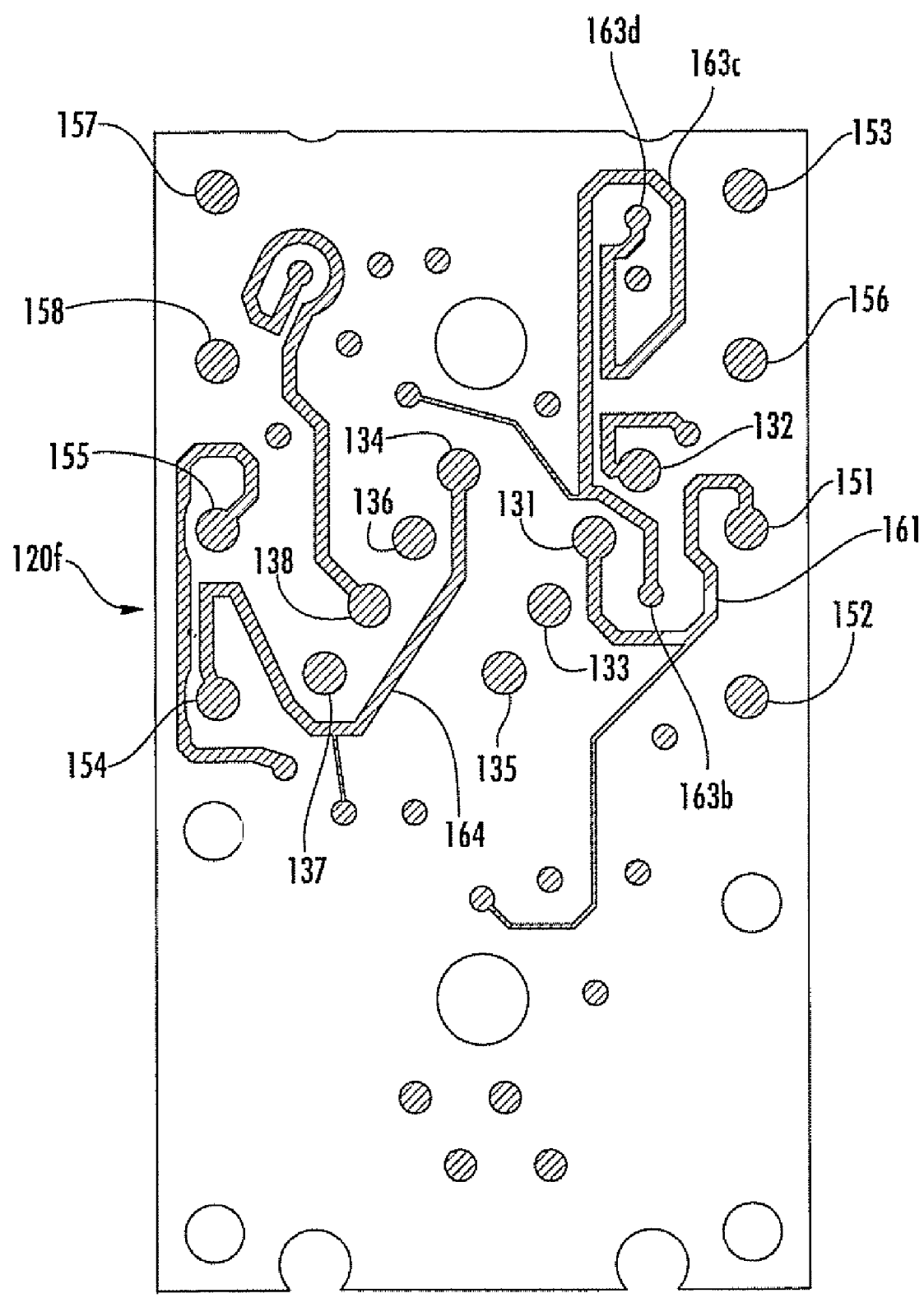

In FIGS. 5A and 5F, each of the contact apertures 131-138 and the IDC apertures 151-158 are shown. In FIGS. 5B-5E, only a subset of the contact apertures 131-138 and/or the DC apertures 151-158 are depicted to simplify the figures (typically only the apertures that connect to electrical traces on the particular layer are shown). The printed wiring board 120 includes a plurality of conductive traces that electrically connect each of the contact apertures 131-138 to a respective one of the IDC apertures 151-158. These conductive traces are shown in FIGS. 5A-5F. Most of the traces are not numbered due to the large number of traces included on each layer of the wiring board 120. The conductive traces may be formed of conventional conductive materials such as, for example, copper, and are deposited on the wiring board 120 via any deposition method known to those skilled in this art to be suitable for the application of conductors. A few of the conductive traces that electrically connect one of the contact apertures 131-138 to its respective IDC aperture 151-158 reside entirely on a single layer of the wiring board 20 (see, e.g., the conductive trace 161 connecting contact aperture 131 to DC aperture 151 and the conductive trace 164 connecting contact aperture 134 to IDC aperture 154 in FIG. 5F). More typically, in this particular embodiment, the conductive trace comprises a plurality of conductive trace segments that reside on multiple layers of the wiring board 120. These conductive trace segments travel between layers through the inclusion of vias (also known as plated through holes) or other layer-transferring structures known to those skilled in this art.

For example, a conductive trace segment 163a electrically connects contact aperture 133 to a plated-through hole 163b on layer 120a of the wiring board 120 (see FIG. 5A). The plated-through hole 163b connects to a second conductive trace segment 163c on layer 120f of the wiring board 120 (see FIG. 5F). A second end of conductive trace segment 163c terminates at another plated-through hole 163d. The plated-through hole 163d connects to a third conductive trace segment 163e on layer 120d of the wiring board 120 (see FIG. 5D) that electrically connects the plated-through hole 163d to the DC aperture 153. The conductive trace segments 163a, 163c, 163e, along with the plated-through holes 163b, 163d together form a conductive trace 163 that electrically connects contact aperture 133 to IDC aperture 153. Among other things, by routing many of the conductive traces on multiple layers of the wiring board 120 it is possible to have the conductive traces for different conductors cross over each other without forming an electrical connection therebetween. As discussed above, such crossovers may facilitate the implementation of compensatory crosstalk elements on the wiring board 120.

As another example, a conductive trace segment 166a electrically connects contact aperture 136 to a plated-through hole 166b on layer 120a of the wiring board 120 (see FIG. 5A). The plated-through hole 166b connects to a second conductive trace segment 166c on layer 120d of the wiring board 120 (see FIG. 5D). A second end of conductive trace segment 166c electrically connects the plated-through hole 166b to the IDC aperture 156. The conductive trace segments 166a, 166c, together with the plated-through hole 166b, form a conductive trace 166 that electrically connects contact aperture 136 to IDC aperture 156.

The wiring board 120 may further include a plurality of crosstalk compensation elements. For example, as shown in FIGS. 5D and 5E, interdigitated finger capacitors 180, 181 and 182, 183 are provided near the forward edge of layers 120d and 120e of printed circuit board 120. Interdigitated finger capacitors 180 and 182 each capacitively couple energy between the conductive paths connected to contacts 104 and 106, while interdigitated finger capacitors 181 and 183 each capacitively couple energy between the conductive paths connected to contacts 103 and 105. These capacitors 180-183 provide a first stage of capacitive differential-to-differential crosstalk compensation that is part of the multi-stage compensation scheme discussed above. As seen from FIGS. 5A, 5D and 5E, the capacitors 180-183 are electrically connected to their respective contacts (i.e., either contacts 103 and 105 or contacts 104 and 106) via the conductive pads 173-176 and plated through holes 183a-186a. Additional stages of crosstalk compensation are also provided on the printed circuit board 120, such as, for example, the interdigitated finger capacitors 184 (on layer 120c) and 187 (on layer 120d) that each capacitively couple energy between the conductive paths connected to contacts 105 and 106, and the interdigitated finger capacitors 185 (on layer 120c) and 186 (on layer 120d) that each capacitively couple energy between the conductive paths connected to contacts 103 and 104.

In order to effectively cancel both NEXT and FEXT forms of crosstalk, it is typically necessary to provide both inductive and capacitive compensation. The crossovers 109a, 109b, 109c in the contact wires of pairs 1, 2 and 4 have been shown in prior art connectors to be an effective mechanism for providing inductive differential-to-differential crosstalk compensation which, when coupled with capacitive differential-to-differential crosstalk compensation (which is typically provided on the wiring board 120), may very effectively compensate for the differential-to-differential crosstalk introduced by the plug and in the industry standard specified mating region between the plug and jack. However, this contact arrangement may be ineffective, and even counterproductive, in providing adequate inductive differential-to-common mode crosstalk compensation in the jack 100. More specifically, the crossovers in contacts 101 and 102; 104 and 105; and 107 and 108 (i.e., in pairs 1, 2, and 4) provide inductive differential-to-differential crosstalk compensation between pairs 1 and 3, pairs 2 and 3, and pairs 4 and 3. However, due to the large physical separation between the contacts of pair 3 and their asymmetric placement relative to pair 2 (and similarly to pair 4), the highest levels of differential-to-common mode crosstalk in the plug and the plug-jack mating region may tend to occur on pairs 2 and 4 when pair 3 is excited differentially. This differential-to-common mode crosstalk between pairs 3 and 2 and between pairs 3 and 4 can negatively impact channel performance. The differential-to-common mode crosstalk occurring when any of the pairs 1, 2 and 4 is excited differentially tends to be much less severe, and consequently less problematic, because the separation between the contacts in each of these pairs is one-third the separation between the contacts of pair 3. The crossovers 109a, 109b, 109c on pairs 1, 2 and 4 inductively compensate for the less severe differential-to-common mode crosstalk occurring when any of pairs 1, 2 or 4 is excited differentially. However, due to the absence of a crossover on the contacts of pair 3, the contact arrangement does not inductively compensate for the typically more severe differential-to-common mode crosstalk on pairs 2 and 4 when pair 3 is differentially excited, and can actually exacerbate this problem. This is especially the when the jack receives a conventional plug such as the one illustrated in U.S. Pat. No. 6,250,949 to Lin.

Turning again to FIG. 6, current splitting techniques that may be used in communications connectors according to embodiments of the present invention will be described. These current splitting techniques may be used to, among other things, reduce the differential-to-common mode crosstalk received by the contacts of pairs 2 and 4 when pair 3 is excited differentially. As shown in the (partial) side view of jack 100 of FIG. 6, the modular jack 100 mates with a modular plug such as, for example, the conventional modular plug 13 illustrated in FIG. 1 above. As shown in FIG. 6, the wiring board 120 includes a contact pad 172 that is located near the forward edge of the top surface 124 of the wiring board 120. As shown in FIG. 6, as the plug 13 mates with the contacts 101-108, either the blades (one representative plug blade is shown in FIG. 6) and/or the housing of the plug 13 force the distal ends of the contacts 101-108 to deflect downwardly toward the top surface 124 of the wiring board 120. Each of the plug blades contact their respective mating contact 101-108 in the contact region 101c-108c of the contact. As a result of this deflection, a portion of the distal end of contact 102 comes into direct and electrical contact with the conductive pad 172. As shown best in FIG. 5A, in this particular embodiment of the present invention, conductive pads 172-176 are located directly under the distal ends of contacts 102-106 such that contacts 102-106 make electrical contact with respective ones of conductive pads 172-176 when a mating plug 13 is inserted into the jack 100.

The contact pads 172-176 may comprise any conductive element that mates with its respective contact so as to electrically connect the contact to one or more conductive traces, plated-through holes or other elements on the wiring board. The contact pads may, for example, comprise immersion tin plated copper pads, small gold plated nail heads, carbon ink pads, etc.

As shown in FIGS. 5A, 5B and 5D, a first conductive trace 123 is connected to contact pad 173, and a second conductive trace 126 is connected to contact pad 176. The first conductive trace 123 electrically connects contact pad 173 to the conductive trace 163 between contact aperture 133 and IDC aperture 153, while the second conductive trace 126 electrically connects contact pad 176 to the conductive trace 166 between contact aperture 136 and DC aperture 156. While in the particular embodiment pictured in FIGS. 3-8 the conductive traces 123 and 126 connect the contact pads 173, 176 to the contact apertures 133, 136, respectively, it will be appreciated in light of the teachings of the present invention that the conductive trace 123 may terminate anywhere along the conductive trace 163 from the contact region 103c of contact 103 to IDC 143, and that the conductive trace 126 may likewise terminate anywhere along the conductive trace 166 from the contact region 106c of contact 106 to IDC 146. The conductive traces 123, 126 may alternatively terminate at the IDC apertures 153, 156, respectively, or could be connected directly to the IDCs 143, 146, respectively.

Figure 8:
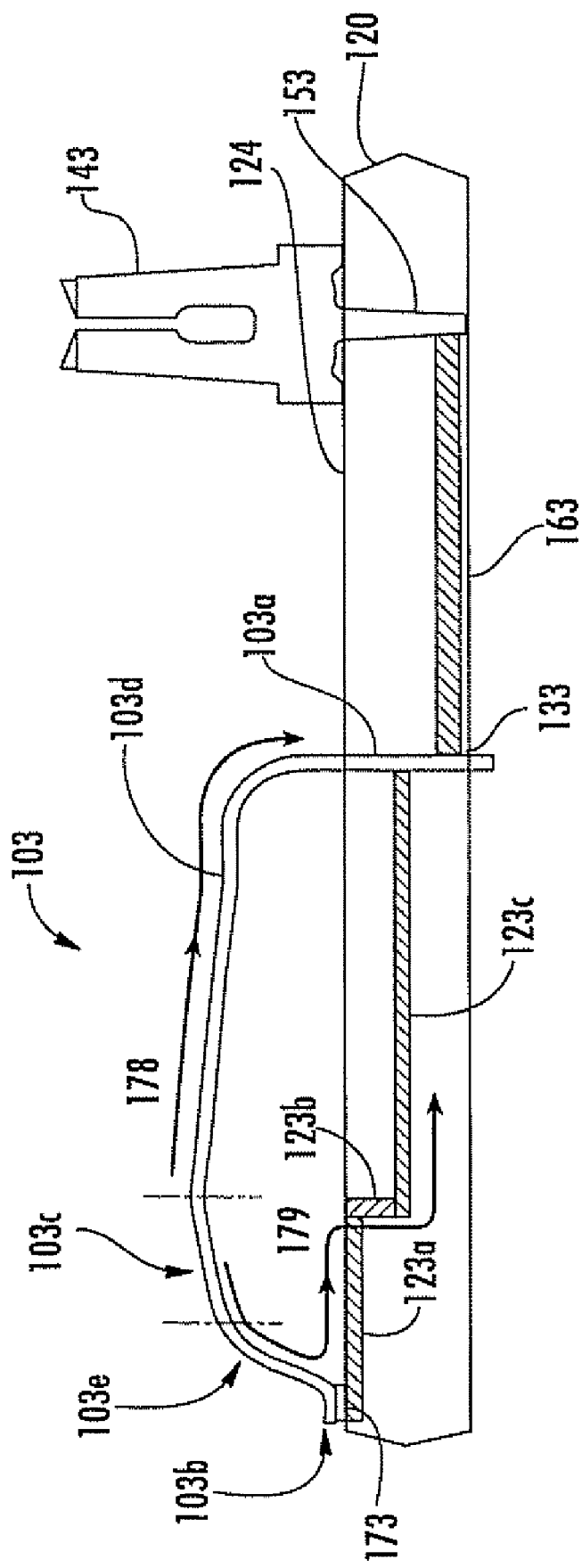
FIG. 8 is a side view of a contact of the jack of FIG. 3 mounted in the wiring board.

FIG. 8 illustrates how a communication signal carried by the plug blade that mates with contact 103 is transferred to the contact region 103c of contact 103. As shown by the arrows in FIG. 8, the communication signal that is transferred to the contact region 103c is split into two components 178 and 179. Component 178 travels from the contact region 103c toward the fixed end 103a of contact 103, where it is transferred to the contact aperture 133 in which the fixed end 103a is mounted. Component 179 travels from the contact region 103c toward the distal end 103b of contact 103. Component 179 is then transferred by the contact pad 173 to the conductive trace segment 123a on the top layer 120a of the printed circuit board 120. Signal component 179 flows from conductive trace segment 123a through the plated-through hole 123b to the conductive trace 123c on layer 120b of wiring board 120. Conductive trace 123c terminates at the contact aperture 133. Thus, the signal components 178 and 179 are recombined at the contact aperture 133, from which they flow via conductive trace 163 to IDC 143.

It can likewise be seen from FIGS. 4 and 5 that a communication signal carried by the plug blade that mates with contact 106 will be transferred to the contact region 106c of contact 106. This signal is then split into first and second components. The first component travels from the contact region 106c toward the fixed end 106a of contact 106, where it is transferred to the contact aperture 136 in which the fixed end 106a is mounted, The second component travels from the contact region 106c toward the distal end 106b of contact 106. The second component is then transferred by the contact pad 176 to the conductive trace segment 126a on the top layer 120a of the printed circuit board 120. The second component flows from conductive trace segment 126a through the plated-through hole 126b to the conductive trace 126c on layer 120d of wiring board 120. Conductive trace 126c terminates at the contact aperture 136. Thus, the first and second components are recombined at the contact aperture 136, from which they flow via conductive trace 166 to IDC 146.

By splitting the information signal on contacts 103 and/or 106 into two components (e.g. components 178/179), it is possible, pursuant to embodiments of the present invention, to reduce the differential-to-common mode crosstalk induced on the contacts 101 and 102 of pair 2 and/or on the contacts 107 and 108 of pair 4 when pair 3 is excited differentially. In particular, in prior art jacks that do not include the signal splitting concepts of embodiments of the present invention, the differential-to-common mode crosstalk received by pair 2 when pair 3 is excited differentially may primarily arise via inductive coupling onto contacts 101 and 102 from the magnetic field formed around contact 103 by the current flowing through contact 103. This magnetic field is formed along the region(s) of contact 103 where current is flowing, namely from the contact region 103c to the fixed end 103a of the contact. Due to the close proximity between contact 103 and contacts 102 and 101 in the region where the current flows through contact 103, this magnetic field may couple a significant amount of energy onto the contacts of pair 2. The magnetic field around contact 106 similarly results in inductive coupling onto contacts 107 and 108 of pair 4.

By splitting the current that flows from the contact region of contact 103 so that conductive paths are provided that allow current to flow to the output terminal 143 in both directions along the contact, the amount of current flowing from the contact region 103c to the fixed end 103a of contact 103 is reduced. As a result, the intensity of the magnetic field around this portion of contact 103 is proportionately reduced, as is the amount of crosstalk energy induced onto contacts 102 and 101 from contact 103. A similar reduction in signal coupling occurs between contact 106 and contacts 107 and 108 due to the signal splitting on contact 106. Moreover, because of, among other things, the vertical separation between the printed circuit board 120 and the portions of contacts 101 and 102 that float above printed circuit board 120, the magnetic field that surrounds conductive trace 123 couples much less strongly with contacts 101 and 102 than does the magnetic field around the segment of contact 103 between contact region 103c and fixed end 103a. As a result, conductive trace 123 does not couple strongly with contacts 101 and 102, and therefore the total amount of coupling from contact 103 and conductive trace 123 to contacts 101 and 102 is reduced as compared to the total amount of coupling from contacts 103 to contacts 101 and 102 in certain prior art connectors. Accordingly, the amount of differential-to-common mode crosstalk received on pair 2 when pair 3 is excited differentially may be reduced. A corresponding reduction in differential-to-common mode crosstalk on pair 4 in response to pair 3 being excited differentially may also be observed due to the similar current splitting on contact 106.

In the jack of FIGS. 3-8, the magnetic field around contact 103 (and contact 106) is extended as current now also flows from the contact region 103c to the portion of the distal end 103b of the contact that mates with contact pad 173 (or 176). However, this extended portion of the magnetic field generated around contact 103 does not result in significant coupling onto contacts 101 and 102 because induced currents cannot flow between their contact regions 101c and 102c and their distal ends 101b and 102b, since no conductive paths connect these distal ends to the corresponding IDC's 141 and 142.

Figure 9:
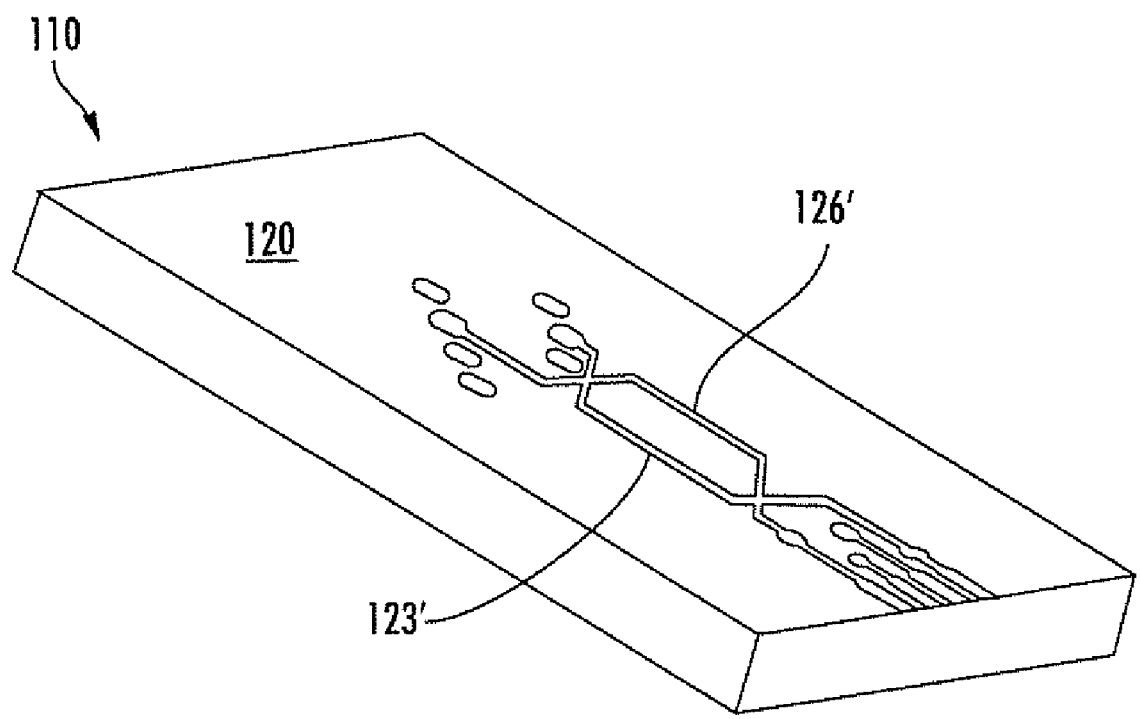
FIG. 9 is a partial perspective view of a wiring board of the jack of FIG. 3 according to further embodiments of the present invention.

FIG. 9 is a schematic diagram that depicts the wiring board 120 and two of the contacts 103, 106 of a communications connector according to further embodiments of the present invention. The connector of FIG. 9 may be very similar to the connector 100 of FIGS. 3-8, discussed above, except that in the connector of FIG. 9, the conductive traces 123 and 126 of the connector of FIGS. 3-8 follow different paths on the printed wiring board 120, and hence are labeled conductive traces 123' and 126' in FIG. 9. In particular, as shown in FIG. 9, conductive trace 123', instead of running directly underneath contact 103, follows a path that moves conductive trace 123' farther away from contacts 101 and 102, and closer to contacts 107 and 108. Similarly, conductive trace 126', instead of running directly underneath contact 106, follows a path that moves conductive trace 126' farther away from contacts 107 and 108, and closer to contacts 101 and 102. In this manner, the magnetic coupling of signal energy from conductive trace 123' onto contacts 101 and 102 may be reduced further by the increased physical distance, and the magnetic coupling of signal energy from conductive trace 126' onto contacts 107 and 108 may similarly be reduced. Moreover, by moving conductive trace 123' closer to contacts 107 and 108, it is possible to cancel a greater percentage of the signal energy coupled from contact 106 onto contacts 107 and 108 (as conductive trace 123' and contact 106 carry opposite signals). Similarly, it is also possible to cancel a greater percentage of the signal energy coupled from contact 103 onto contacts 101 and 102 (as conductive trace 126' and contact 103 carry opposite signals). Thus, in this manner, even further reduction in the differential-to-common mode crosstalk onto pairs 2 and 4 in response to the differential excitation of pair 3 can be achieved. In the particular embodiment of FIG. 9, conductive trace 123' is moved closer to contacts 107 and 108 and conductive trace 126' is moved closer to contacts 101 and 102 by crossing conductive traces 123' and 126' twice on the wiring board 120. While in FIG. 9, for ease of explanation, conductive traces 123' and 126' are both shown as running on the top layer of the wiring board, it will be understood that in practice at least part of one or both of these traces would typically be implemented on different layers of the wiring board in order to, among other things, facilitate implementing the above-described crossover.

Figure 10:
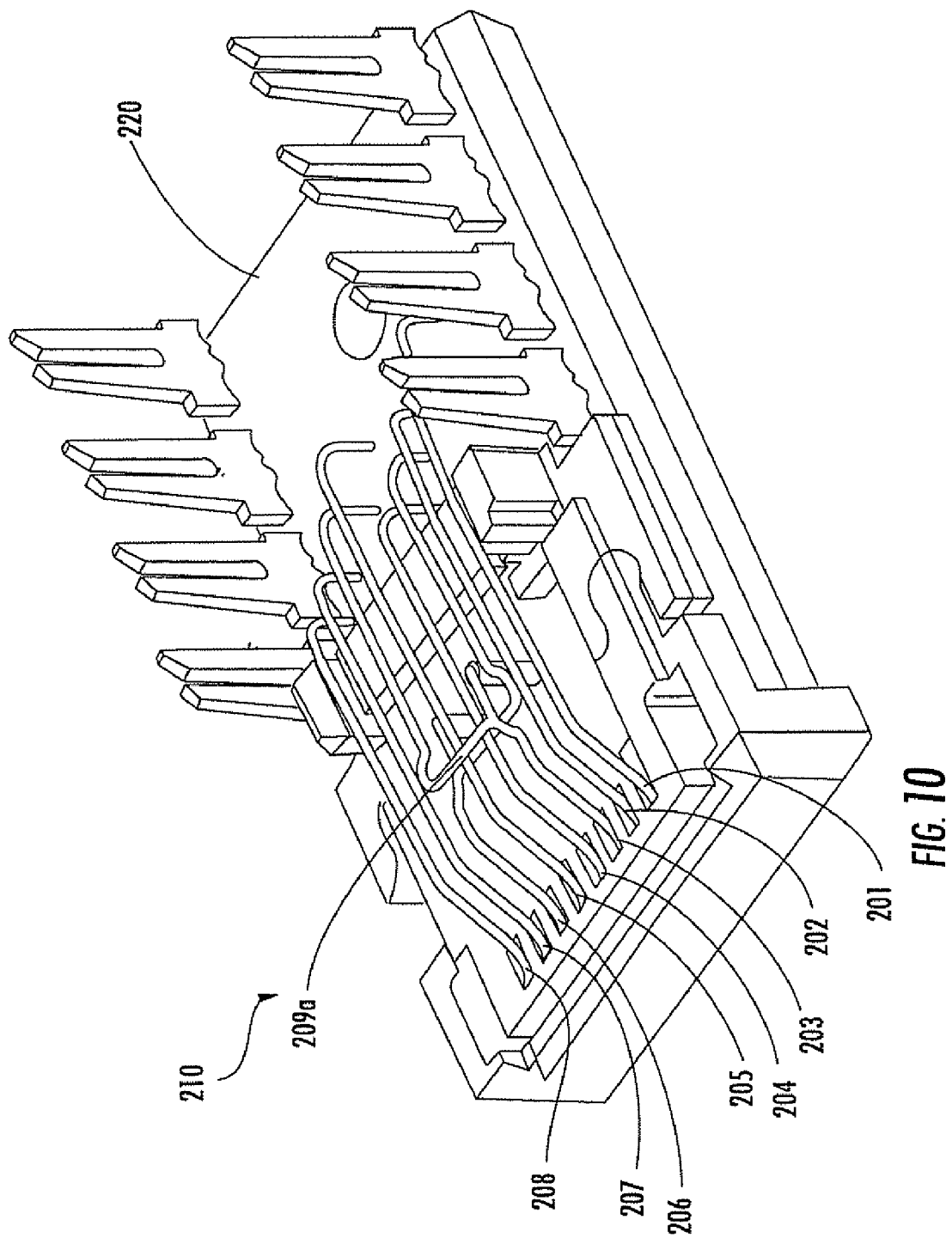
FIG. 10 is a perspective view of a communications insert of a jack according to further embodiments of the present invention.
Figure 11:
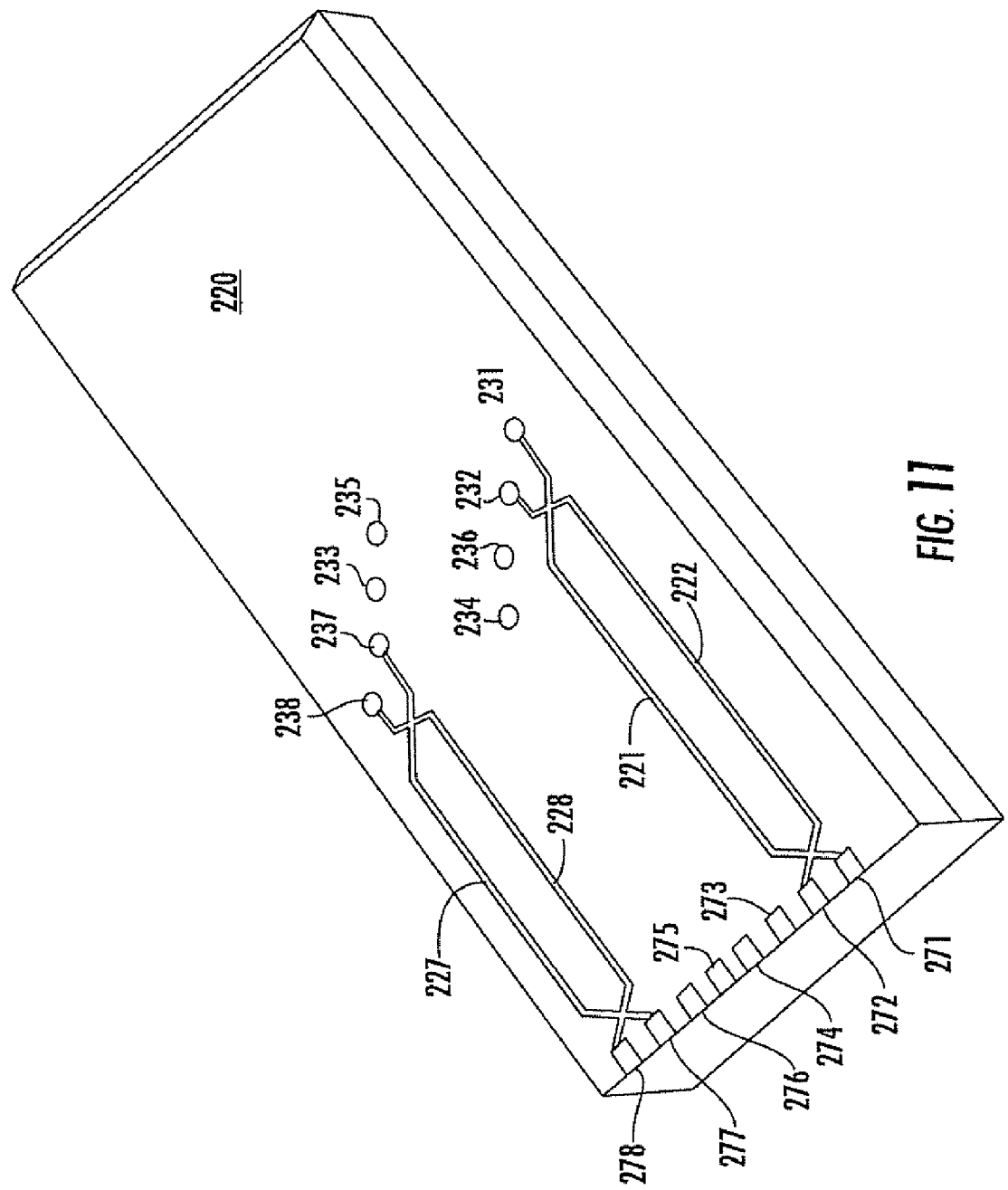
FIG. 11 is a plan view of a wiring board of the jack of FIG. 10.

It will also be appreciated in light of the present disclosure that split current paths may be included on pairs other than, or additional to, pair 3. By way of example, FIGS. 10 and 11 depict the communications insert 210 of another jack 200 according to further embodiments of the present invention. The jack 200 is very similar to the jack 100 depicted in FIGS. 3-8 above, except that (1) the pair 3 contacts include a crossover instead of the pair 1, 2 and 4 contacts and (2) current splitting is performed on pairs 2 and 4 instead of pair 3. Specifically, as shown in FIG. 10, eight contact wires 201-208 are mounted on a top surface of a printed circuit board 220. Contacts 204 and 205 comprise pair 1, contacts 201 and 202 comprise pair 2, contacts 203 and 206 comprise pair 3, and contacts 207 and 208 comprise pair 4. In contrast to the jack 100 of FIGS. 3-8, contacts 201-202, 204-205 and 207-208 are straight contacts that do not include a crossover. Contacts 203 and 206, on the other hand include a crossover 209a. In addition to providing differential-to-differential crosstalk compensation on the same pair combinations compensated by the jack 100 of FIG. 3, this crossover 209a also provides compensation for the differential-to-common mode crosstalk induced on pairs 2 and 4 when pair 3 is excited differentially.

Since the jack 200 does not include crossovers on pairs 2 and 4, it does not compensate for the differential-to-common mode crosstalk occurring on pair 3 or pair 1 when pairs 2 or 4 are excited differentially. The impact of such differential-to-common mode crosstalk can be reduced, however, by implementing the current splitting techniques according to embodiments of the present invention on the conductors of pairs 2 and 4 in the jack 200, as shown in FIG. 11. In particular, a plurality of conductive pads 271-278 are provided adjacent the top forward edge of the wiring board 220. These conductive pads are aligned under the distal ends of contacts 201-208, respectively. The contacts 201-208 are mounted in contact apertures 231-238, which are shown in FIG. 11. As is also shown in FIG. 11, a conductive trace 221 is provided on the wiring board 220 that electrically connects contact pad 271 to contact aperture 231. A second conductive trace 222 is provided on the wiring board 220 that electrically connects contact pad 272 to contact aperture 232. A third conductive trace 227 is provided on the wiring board 220 that electrically connects contact pad 277 to contact aperture 237. A fourth conductive trace 228 is provided on the wiring board 220 that electrically connects contact pad 278 to contact aperture 238. In the particular embodiment shown in FIG. 11, the conductive traces 221 and 222 cross twice on the wiring board 220, and the conductive traces 227 and 228 cross twice on the wiring board 220. While conductive traces 221, 222, 227 and 228 are all shown in FIG. 11 as being implemented on the top surface of the wiring board 220, it will be appreciated that part or all of these conductive traces would typically include conductive trace segments that reside on other layers of the wiring board 220 in order to, among other things, facilitate implementing the above-described crossovers. Thus by splitting the current on the conductors of pair 2 and pair 4 so that a portion of the current flows through the distal ends of the respective contacts and through conductive traces 221, 222, 227 and 228 on the wiring board 220, the differential-to-common mode crosstalk induced onto pair 3 or pair 1 when either of pairs 2 or pair 4 are differentially excited can be reduced. It will be appreciated, however, that the conductive traces 221 and 222 or the conductive traces 227 and 228, shown in FIG. 11, need neither be twice crossed, nor crossed at all, in order to achieve a reduction in the aforementioned differential-to-common mode crosstalk.

Pursuant to yet further embodiments of the present invention, connectors may be provided in which the current flowing through one or both of contacts 104 and 105 of pair 1 may be split to reduce the differential-to-common mode crosstalk from pair 1 to the side pairs 2 and 4. It will also be appreciated that the split current paths may be provided on only one conductor of a differential pair.

Pursuant to embodiments of the present invention, the percentage according to which the incident signal is divided between the two split current paths (e.g., components 178 and 179 described above with respect to the example of FIG.

8) may be controlled to improve the performance of the connector 100. As noted above, the portions of the contacts that include the crossovers 109a, 109b, 109c provide differential-to-differential crosstalk compensation, and the connector 100 may be designed to allow sufficient current flow through the fixed ends 103a and 106a of the contacts 103 and 106, respectively, so as to provide sufficient inductive differential-to-differential crosstalk compensation. However, less than 100% of the current flows through the fixed ends 103a, 106a of contacts 103 and 106, respectively, in order to, among other things, reduce the differential-to-common mode crosstalk received by the contacts of pairs 2 and 4 when pair 3 is excited differentially. In certain embodiments of the present invention, the connector 100 may be configured so that at least 50% of the signal current incident on a contact (such as contacts 103 and 106) that includes a split signal carrying path travels on the signal path that has current flowing toward the distal ends 103b, 106b of the contacts and through contact pads 173, 176. In some embodiments, the connector 100 maybe configured so that at least 75% of the signal current incident on a contact (such as contacts 103 and 106) that includes a split signal carrying path travels on the signal path that has current flowing toward the distal ends 103b, 106b of the contacts and through contact pads 173, 176.

Figure 12:
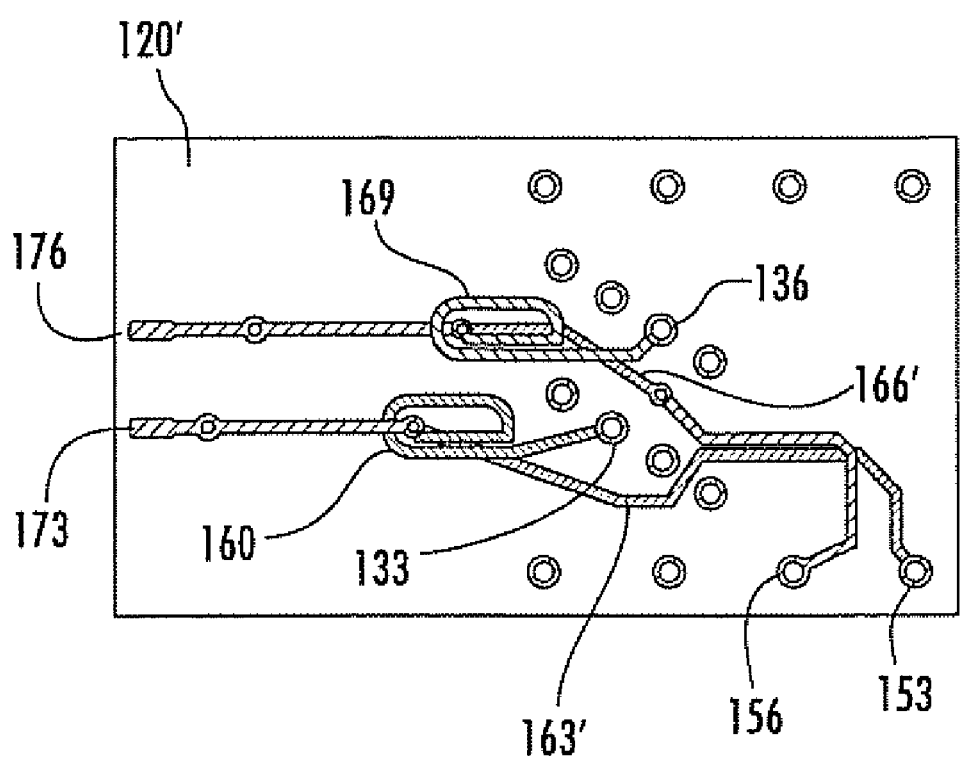
FIG. 12 is a plan view of a wiring board according to further embodiments of the present invention.

The percentage of signal current that flows along each of the split signal paths may be controlled, for example, by adjusting the thickness, length, width and materials of the conductive elements (e.g., contacts, contact pads, conductive trace segments, etc.) in each of the split signal paths, or by replacing these conductive elements or certain segments of them by embedded or discreet resistors. Moreover, in certain embodiments of the present invention, self-coupling sections may be provided on certain of the conductors within the connector in order to control the amount of current flowing down the split current paths between an input terminal (e.g., contact) and output terminal of the connector. For example, FIG. 12 is a plan view of a wiring board 120' that could be used with the connector 100 instead of the wiring board 120 discussed above. As shown in FIG. 12, a conductive trace 163' connects contact aperture 133 to IDC 143. The conductive trace 163', along with the portion of the contact 103 extending from the contact region 103c to the fixed portion 103a (the contact 103 is not shown in FIG. 12, but is depicted in FIGS. 3-4 and 7) comprises the first of two split current paths from the contact region 103c to DC 143 as described above with respect to FIGS. 3-8. As shown in FIG. 12, the conductive trace 163' includes a self-coupling section 160 where a first portion of the conductive trace 163' inductively couples signal energy onto a second portion of the conductive trace 163'. This self inductance may act to force more current to flow through the second of the split current paths which includes the portion of the contact 103 between the contact region 103c and the contact distal end 103b. Thus, self-inductive sections on a current path may also be used to control the amount of current that flows through the two separate current paths that may be provided pursuant to embodiments of the present invention.

It will be appreciated that the self inductive section may be implemented in a variety of different ways, and need not be implemented in the particular manner shown in the embodiment of FIG. 12. For example, in other embodiments, the self-inductive sections on the current paths could be implemented on multiple layers of the wiring board using plated-through vias or they may be replaced by embedded or discreet inductors.

In various embodiments of the present invention discussed above, two separate conductive paths are provided from the contact region of a contact of the communications connector to another point (an "intersection point") in the conductive path between the contact region and an output terminal of the connector such as, for example, the contact aperture, where the two separate conductive paths intersect. As these two separate conductive paths join or meet at both the contact region and at the intersection point, the two separate conductive paths together form a "conductive loop." A signal is transferred onto this conductive loop at, for example, the contact region of a contact and is then split so that part of the signal current travels around the loop in a clockwise direction, while the remainder of the signal current travels around the loop in a counterclockwise direction. The signals are recombined at the intersection point at the far end of the conductive loop, where they are transferred to another conductor or to an output terminal of the connector. Thus, it will be appreciated that herein, the term "conductive loop" refers to a conductive element or elements that form two separate conductive paths from an input region to the loop (e.g., the contact region of the contact) to an output region of the loop (e.g., the intersection point). The conductive loops of embodiments of the present invention may include conductive elements that branch off from the loop such as, for example, traces on a printed circuit board that electrically connect to interdigitated finger capacitors. It will be appreciated that the conductive loop need not be circular, but instead can have any 2-dimensional or 3-dimensional shape.

The skilled artisan will recognize that, although eight contact wires are illustrated and described herein, other numbers of contact wires may be employed. For example, 16 contact wires may be employed, and one or more crossovers that cross over a pair of contact wires sandwiched therebetween may be included in those contact wires. The skilled artisan will likewise recognize that that contacts can extend into the plug aperture of the jack frame from a variety of different directions, such as from the front of the jack, from the back of the jack, and from the bottom of the jack or the top of the jack. The skilled artisan will also recognize that more than two current paths may be provided. For example, the current flowing through a connector may be split into three, four or more current paths. Thus, while the examples described herein focus on embodiments in which two split current paths are provided, it will be appreciated that the present invention is not limited to such embodiments.

Further, those skilled in this art will recognize that other jack configurations may also be suitable for use with the present invention. For example, as discussed above, other configurations of jack frames, covers and terminal housings may also be employed with the present invention. As another example, the contact wires may have a different profile (an exemplary alternative profile is depicted in U.S. Pat. No. 6,165,023 to Troutman et al.), or they may be substituted for by conductive paths on a flexible circuit, or they may mount in locations that do not follow the "dual diagonal" mounting scheme illustrated herein (an exemplary alternative in which the contact wires are staggered is illustrated in U.S. Pat. No. 6,116,964 to Goodrich et al). As a further example, the IDCs may mount in a different pattern on the wiring board, or some other type of output terminal may be used. Those skilled in this art will also recognize that embodiments of the wiring board described above may be employed in other environments in which a communications jack may be found. For example, modular jacks according to embodiments of the present invention may be included within a multi-jack patch panel insert such as, for example, a 6-jack set of modular jacks. Other environments may also be possible.

Those skilled in the art will further recognize that the current splitting techniques of this invention can be implemented, with similar beneficial effects, by configuring the conductors of jacks of unitized construction utilizing metallic lead-frame structures instead of printed wiring boards to achieve the required connectivity and crosstalk compensation. It will also be appreciated that the current splitting techniques of the present invention may be used for a variety of different purposes including, for example, reducing differential-to-common mode or differential-to-differential crosstalk, improving return loss or attenuation, providing redundant communication paths, limiting the current flowing through a particular path, increasing current carrying capacity, etc.

Further, those skilled in the art will recognize the reciprocity that exists between the differential to common mode crosstalk induced on a first pair, when a second pair is excited differentially, and the common mode to differential signal induced on the second of these pairs when the first of these pairs is excited common-modally, with the common mode to differential crosstalk equaling the differential to common mode crosstalk multiplied by a constant, that constant being the ratio of the differential to common mode impedances. Consequently, when an improvement occurs, due to the current invention, in the differential to common mode crosstalk between two pairs when one of these pairs is excited differentially, a corresponding improvement occurs in the common mode to differential crosstalk between these two pairs when the other of these pairs is excited common-modally.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector, comprising:
    a first contact having a first section and a second section that are separated by a contact region;
    a first output terminal that is electrically connected to the contact region of the first contact by a first conductive path;
    a second contact having a first section and a second section that are separated by a contact region;
    a second output terminal that is electrically connected to the contact region of the second contact by a second conductive path;
    wherein the first conductive path includes a first segment that extends from the contact region of the first contact through at least a portion of the first section of the first contact and a second segment that extends from the contact region of the first contact through at least a portion of the second section of the first contact.

2. The communications connector of claim 1, wherein the first and second segments of the first conductive path intersect at the contact region of the first contact and at a first end of a third segment of the first conductive path that connects the first and second segments of the first conductive path to the first output terminal.

3. The communications connector of claim 1, wherein an end portion of the first section of the first contact is mounted in a wiring board and wherein the second segment of the first conductive path includes a contact pad on the wiring board that mates with a portion of the second section of the first contact when a mating connector is inserted into the communications connector.

4. The communications connector of claim 3, wherein the second segment of the first conductive path further includes a first conductive trace on the wiring board that is electrically connected to the contact pad.

5. The communications connector of claim 4, wherein the first conductive path further includes a second conductive trace on the wiring board that comprises at least part of an electrical path between the first section of the first contact and the first output terminal.

6. The communications connector of claim 5, wherein the first conductive trace intersects the electrical path between the first section of the first contact and the first output terminal.

7. The communications connector of claim 3, further comprising:
    a third contact;
    a third output terminal that is connected to a contact region of the third contact by a third conductive path;
    a fourth contact; and
    a fourth output terminal that is connected to a contact region of the fourth contact by a fourth conductive path;
    wherein the first contact and the second contact together comprise a first differential pair of contacts, and
    wherein the third contact and the fourth contact together comprise a second differential pair of contacts.

8. The communications connector of claim 7, wherein the contact region of the third contact and the contact region of the fourth contact are sandwiched between the contact region of the first contact and the contact region of the second contact.

9. The communications connector of claim 1, wherein the second conductive path includes a first segment that extends from the contact region of the second contact through at least a portion of the first section of the second contact and a second segment that extends from the contact region of the second contact through at least a portion of the second section of the second contact.

10. The communications connector of claim 3, wherein the first and second segments of the first conductive path are sized and configured so that at least 50 percent of a current applied to the contact region of the first contact travels through the second segment of the first conductive path.

11. The communications connector of claim 3, wherein the first and second segments of the first conductive path are sized and configured so that at least 75 percent of a current applied to the contact region of the first contact travels through the second segment of the first conductive path.

12. The communications connector of claim 4, wherein the first contact and the second contact together comprise a first differential pair of contacts, the connector further comprising:
    a second differential pair of contacts between the first contact and the second contact;
    a third differential pair of contacts adjacent the first contact; and
    a fourth differential pair of contacts adjacent the second contact, and wherein the second conductive path includes a first segment that extends from the contact region of the second contact through at least a portion of the first section of the second contact and a second segment that extends from the contact region of the second contact through at least a portion of the second section of the second contact, wherein the first and second segments of the second conductive path intersect at the contact region of the second contact and at a first end of a third segment of the second conductive path that connects the first and second segments of the second conductive path to the second output terminal, wherein an end portion of the first section of the second contact is mounted in the wiring board and wherein the second segment of the second conductive path includes a second contact pad on the wiring board that mates with a portion of the second section of the second contact when a mating connector is inserted into the communications connector, and wherein the second segment of the second conductive path further includes a third conductive trace on the wiring board that is electrically connected to the second contact pad.

13. The communications connector of claim 12, wherein the first conductive trace and the third conductive trace form a crossover on the wiring board.

14. The communications connector of claim 4, further comprising:
a second differential pair of contacts between the first contact and the second contact; and
a third differential pair of contacts adjacent the first contact,
wherein the magnetic coupling between the first contact and the third differential pair that results when a first current is applied to the contact region of the first contact is reduced due to having some of the first current flowing in the second segment.

15. The communications connector of claim 1, wherein the first segment and the second segment together form a conductive loop.

16. The communications connector of claim 15, wherein when the current on the first segment has an instantaneous current that flows in a clockwise direction on the conductive loop, the current on the second segment has an instantaneous current that flows in a counterclockwise direction.

17. The communications connector of claim 7, wherein the third and fourth contacts crossover each other.

18. The communications connector of claim 17, the connector further comprising a third differential pair of contacts, wherein the contact regions of the contacts forming the third differential pair of contacts are sandwiched by the contact region of the third contact and the contact region of the fourth contact.

19. The communications connector of claim 17, wherein the contact region of the third contact and the contact region of the fourth contact are sandwiched between the contact region of the first contact and the contact region of the second contact.

20. The communications connector of claim 17, wherein the contact region of the first contact and the contact region of the second contact are sandwiched between the contact region of the third contact and the contact region of the fourth contact.

21. The communications connector or claim 20, the connector further comprising a third differential pair of contacts, wherein the third differential pair of contacts is adjacent the second differential pair of contacts.

22. The communications connector of claim 1, further comprising a self inductive section on the first conductive path.

23. A modular jack comprising:
a plurality of contacts, each of the contacts including a fixed portion, a distal end and a contact region that is located between the fixed portion and the distal end;
a plurality of output terminals that are electrically connected to respective ones of the plurality of contacts;
wherein the electrical connection between a first of the plurality of contacts and a first of the plurality of output terminals to which it is electrically connected comprises a first conductive path and a separate second conductive path such that signal energy incident on the first of the plurality of contacts is split into a first component that travels to the first of the plurality of output terminals via the first conductive path and a second component that travels to the first of the plurality of output terminals via the second conductive path.

24. The modular jack of claim 23, wherein the first conductive path and the second conductive path join together at an intersection point, and wherein a third conductive path electrically connects the intersection point to the first of the plurality of output terminals.

25. The modular jack of claim 24, wherein the first conductive path extends from the contact region on the first of the plurality of contacts through the fixed portion of the first of the plurality of contacts to the intersection point.

26. The modular jack of claim 25, wherein the second conductive path extends from the contact region on the first of the plurality of contacts through at least a portion of the first of the plurality of contacts between the contact region and the distal end of the first of the plurality of contacts to the intersection point.

27. The modular jack of claim 26, wherein the second conductive path further includes a contact pad on a wiring board that makes electrical contact with the first of the plurality of contacts when a mating connector is inserted into the communications connector, and wherein the second conductive path also includes a first conductive trace on the wiring board that electrically connects the contact pad to the intersection point.

28. The modular jack of claim 23, wherein the first conductive path and the separate second conductive path together form a conductive loop.

29. The modular jack of claim 28, wherein when the current on the first conductive path has an instantaneous current that flows in a clockwise direction on the conductive loop, the current on the second conductive path has an instantaneous current that flows in a counterclockwise direction.

30. A modular jack, comprising:
a first contact having a fixed end, a free end and a contact region that is configured to make electrical contact with a contact of a mating modular plug;
a first output terminal;
a first conductive path that is configured to carry current flowing from the contact region of the first contact toward the free end of the first contact to the first output terminal; and
a second conductive path that is configured to carry current flowing from the contact region of the first contact toward the fixed end of the first contact to the first output terminal.

31. The modular jack of claim 30, further comprising:
a wiring board that includes a first contact pad that makes electrical contact with the first contact when the modular plug is inserted into the modular jack and a first conductive trace that connects the first contact pad to the first output terminal,
wherein the first contact pad and the first conductive trace are part of the first conductive path.

32. The modular jack of claim 31, wherein the second conductive path includes a second conductive trace on the wiring board that connects the fixed end of the first contact to the first output terminal.

33. The modular jack of claim 32, wherein the first conductive trace includes at least a portion of the second conductive trace.

34. The modular jack of claim 31, further comprising:
a second contact having a fixed end, a free end and a contact region that is configured to make electrical contact with a second contact of a mating modular plug;
a second output terminal;
a third conductive path that is configured to carry current flowing from the contact region of the second contact towards the free end of the second contact to the second output terminal;
a fourth conductive path that is configured to carry current flowing from the contact region of the second contact towards the fixed end of the second contact to the second output terminal; and
a second contact pad on the wiring board that makes electrical contact with the second contact when the modular plug is inserted into the modular jack and a third conductive trace that connects the second contact pad to the second output terminal,
wherein the second contact pad and the third conductive trace are part of the third conductive path, and
wherein the first and second contacts comprise a first differential pair.

35. The modular jack of claim 34, further comprising:
a second differential pair of contacts between the first contact and the second contact;
a third differential pair of contacts adjacent the first contact; and
a fourth differential pair of contacts adjacent the second contact, and
wherein the first conductive trace and the third conductive trace cross on the wiring board.

36. The modular jack of claim 30, wherein the first conductive path and the separate second conductive path together form a conductive loop.

37. The modular jack of claim 30, further comprising a self inductive section on the second conductive path.

38. A method of conducting a communications signal through a communications connector, the method comprising:
receiving the communications signal at a contact region of a contact of the communications connector;
splitting the received communications signal into a first component and a second component;
conducting the first component through at least a portion of the communications connector on a first conductive path;
conducting the second component through at least a portion of the communications connector on a second conductive path that is different from the first conductive path;
recombining the first component and the second component to form a recombined communications signal; and
outputting the recombined communications signal at an output terminal of the communications connector.

* * * * *